(12) United States Patent
Kim et al.

(10) Patent No.: US 12,132,141 B2
(45) Date of Patent: Oct. 29, 2024

(54) LIGHT EMITTING ELEMENT, MANUFACTURING METHOD THEREFOR, AND DISPLAY DEVICE

(71) Applicant: Samsung Display Co., LTD., Yongin-si (KR)

(72) Inventors: Dong Uk Kim, Hwaseong-si (KR); Se Young Kim, Gwangju (KR); Hyung Rae Cha, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 479 days.

(21) Appl. No.: 17/624,065

(22) PCT Filed: Jun. 3, 2020

(86) PCT No.: PCT/KR2020/007231
§ 371 (c)(1),
(2) Date: Dec. 30, 2021

(87) PCT Pub. No.: WO2021/002599
PCT Pub. Date: Jan. 7, 2021

(65) Prior Publication Data
US 2022/0359783 A1    Nov. 10, 2022

(30) Foreign Application Priority Data
Jul. 2, 2019   (KR) .................. 10-2019-0079429

(51) Int. Cl.
*H01L 33/00*   (2010.01)
*H01L 33/24*   (2010.01)
*H01L 33/38*   (2010.01)

(52) U.S. Cl.
CPC .......... *H01L 33/0075* (2013.01); *H01L 33/24* (2013.01); *H01L 33/38* (2013.01)

(58) Field of Classification Search
CPC ..... H01L 33/0075; H01L 33/24; H01L 33/38; H01L 2933/0016; H01L 27/156;
(Continued)

(56) References Cited

U.S. PATENT DOCUMENTS 8,872,214 B2    10/2014   Negishi et al.
9,252,328 B2    2/2016    Crowder et al.
(Continued)

FOREIGN PATENT DOCUMENTS

JP    2008-235444    10/2008
KR    10-2011-0043461    4/2011
(Continued)

OTHER PUBLICATIONS

Extended European Search Report for European Application No. 20834799.7, dated Jun. 23, 2023.
(Continued)

*Primary Examiner* — David Vu
(74) *Attorney, Agent, or Firm* — KILE PARK REED & HOUTTEMAN PLLC

(57) ABSTRACT

A light emitting element includes a semiconductor core having at least a partial region extending in a direction and including a first end, a second end, and a main body part between the first end and the second end; a first electrode layer surrounding the second end of the semiconductor core; a second electrode layer surrounding at least the first end of the semiconductor core and spaced apart from the first electrode layer; and an insulating layer surrounding the semiconductor core, the first electrode layer and the second electrode layer. The second end of the semiconductor core has a diameter smaller than a diameter of the main body part.

23 Claims, 24 Drawing Sheets

(58) Field of Classification Search
CPC ....... H01L 33/20; H01L 33/16; H01L 33/385; H01L 33/005
See application file for complete search history.

(56) References Cited

U.S. PATENT DOCUMENTS

| | | | |
|---|---|---|---|
| 9,287,242 | B2 | 3/2016 | Shibata et al. |
| 9,842,966 | B2 * | 12/2017 | Cha .......................... H01L 33/20 |
| 2012/0326181 | A1 | 12/2012 | Shibata et al. |

FOREIGN PATENT DOCUMENTS

| | | |
|---|---|---|
| KR | 10-2011-0046017 | 5/2011 |
| KR | 10-2012-0120377 | 11/2012 |
| KR | 10-2016-0053329 | 5/2016 |
| KR | 10-2017-0000214 | 1/2017 |

OTHER PUBLICATIONS

International Search Report, with English translation, corresponding to International Application No. PCT/KR2020/007231 dated Sep. 16, 2020.
Written Opinion, with English translation, corresponding to International Application No. PCT/KR2020/007231, dated Sep. 16, 2020.

* cited by examiner

W: W1, W2

FIG. 19
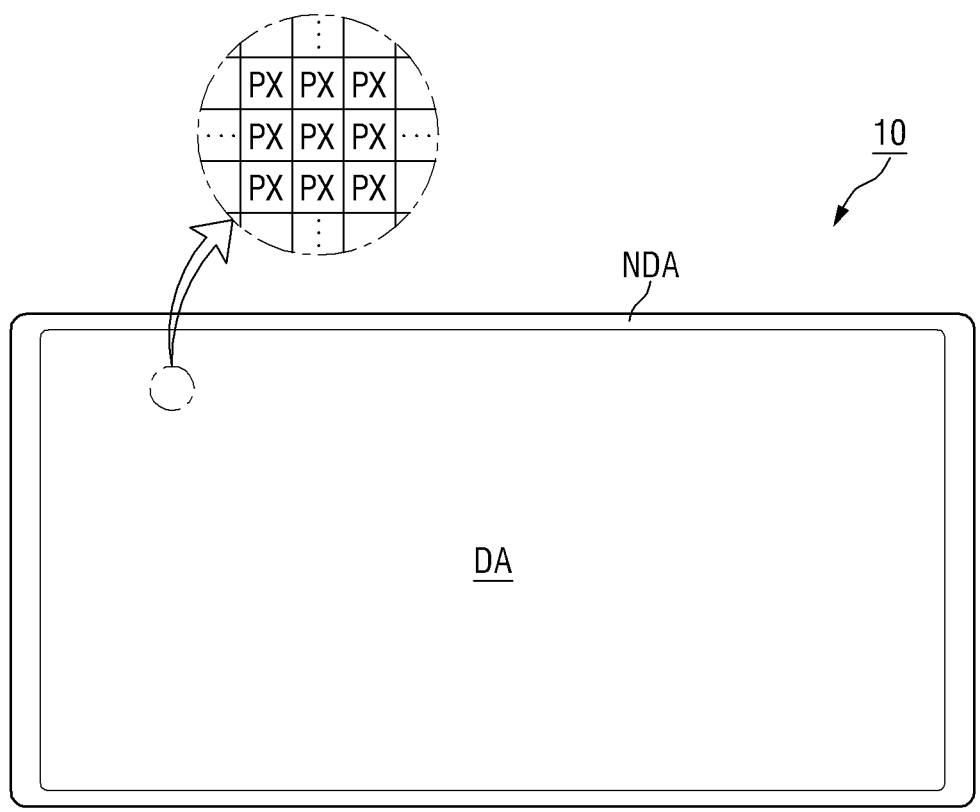
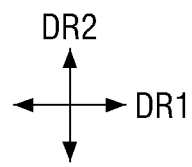

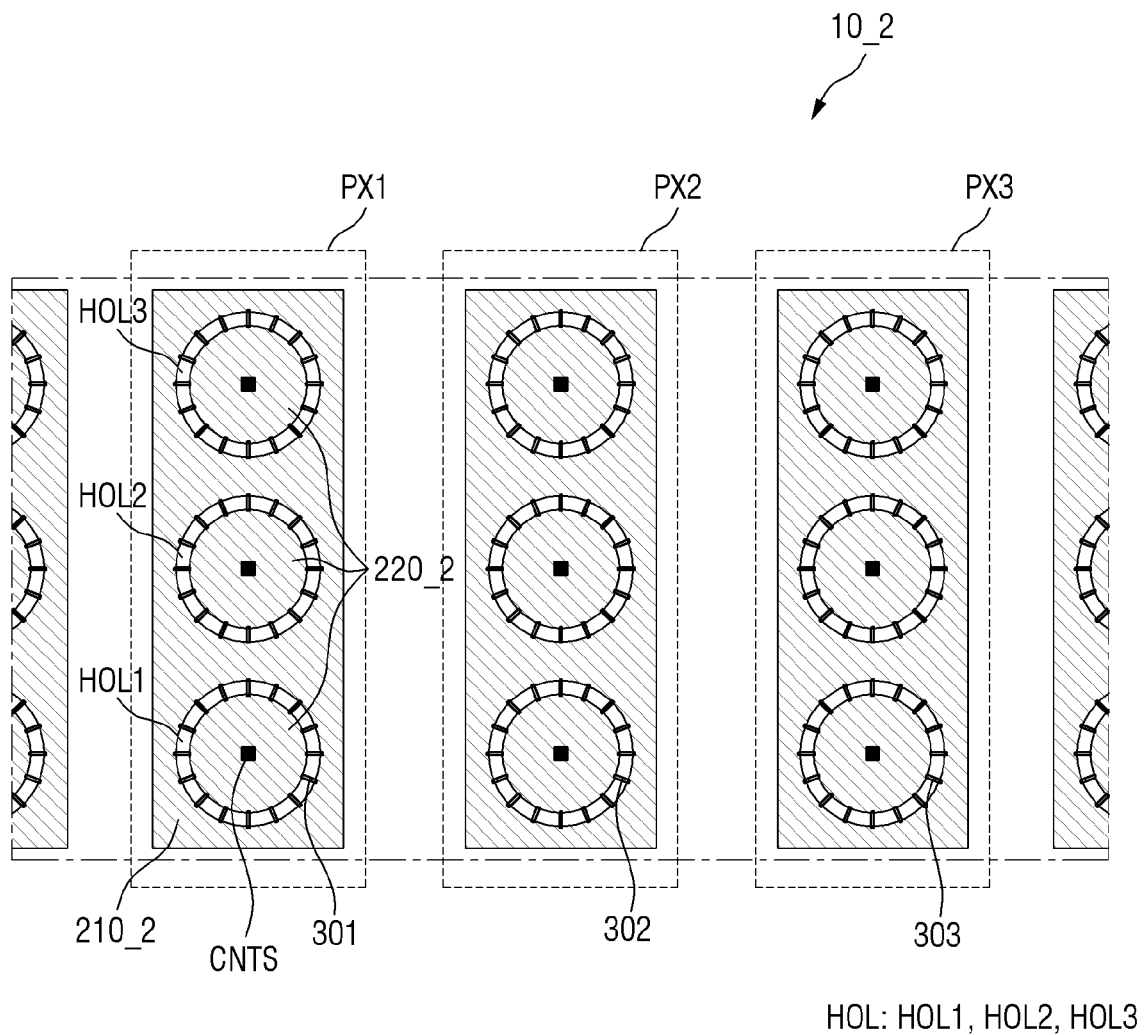

LIGHT EMITTING ELEMENT, MANUFACTURING METHOD THEREFOR, AND DISPLAY DEVICE

CROSS-REFERENCE TO RELATED APPLICATION(S)

This application is a national entry of International Application No. PCT/KR2020/007231, filed on Jun. 3, 2020, which claims under 35 U.S.C. §§ 119(a) and 365(b) priority to and benefits of Korean Patent Application No. 10-2019-0079429, filed on Jul. 2, 2019, in the Korean Intellectual Property Office (KIPO), the entire contents of which are incorporated herein by reference.

TECHNICAL FIELD

The disclosure relates to a light emitting element, a manufacturing method therefor, and a display device.

DESCRIPTION OF RELATED ART

The importance of display devices is increasing with the development of multimedia. Accordingly, various types of display devices such as organic light-emitting display (OLED) devices and liquid crystal display (LCD) devices are being used.

A display panel such as an OLED panel or an LCD panel is a device included in a display device to display an image. Among such display panels, a light-emitting element may be provided as a light-emitting display panel, and examples of a light-emitting diode (LED) include an organic LED (OLED) using an organic material as a fluorescent material and an inorganic LED using an inorganic material as a fluorescent material.

SUMMARY

Aspects of the disclosure provide a light emitting element manufactured by growing semiconductor crystals and including electrode layers formed to be spaced apart from each other by the same process, and a manufacturing method therefor.

Aspects of the disclosure provide also provide a display device including the light emitting element and electrodes in contact with different electrode layers.

It should be noted that aspects of the disclosure are not limited thereto and other aspects, which are not mentioned herein, will be apparent to those of ordinary skill in the art from the following description.

According to an embodiment of the disclosure, a light emitting element may comprise a semiconductor core having at least a partial region extending in a direction and including a first end, a second end, and a main body part between the first end and the second end, a first electrode layer surrounding the second end of the semiconductor core, a second electrode layer surrounding at least the first end of the semiconductor core and spaced apart from the first electrode layer, and an insulating film surrounding the semiconductor core, the first electrode layer, and the second electrode layer. The second end of the semiconductor core may have a diameter smaller than a diameter of the main body part.

The first electrode layer may be spaced apart from the main body part and surround at least a partial region of the second end, and the second electrode layer may surround the first end and the main body part.

In the first electrode layer, a thickness of a side adjacent to the main body part may be smaller than a thickness of another side opposite to the side.

In the main body part, a diameter of a region adjacent to the first end may be greater than a diameter of a region adjacent to the second end.

The first end may have an inclined outer surface.

The semiconductor core may include a first semiconductor layer, an active layer surrounding at least a partial region of the first semiconductor layer, and a second semiconductor layer surrounding a partial region of the first semiconductor layer and the active layer. The first electrode layer may electrically contact the first semiconductor layer, and the second electrode layer may electrically contact the second semiconductor layer.

The first semiconductor layer may include a first portion extending in the direction, a second portion located on a side of the first portion, and a third portion located on another side of the first portion and extending in the direction. The second portion may have an inclined outer surface.

A diameter of the third portion may be smaller than a diameter of the first portion, and an outer surface of the third portion may be recessed from an outer surface of the first portion toward a center of the first semiconductor layer.

The first electrode layer may surround a partial region of the outer surface of the third portion and may be spaced apart from the first portion, and an end surface of the third portion opposite to the first portion may be exposed.

The active layer may surround an outer surface of the first portion.

The first semiconductor layer may be doped with first conductivity type impurities, the second semiconductor layer may be doped with second conductivity type impurities, the first semiconductor layer may include a doped region in which at least a partial region of the second portion is doped with the second conductivity type impurities, and the active layer may be also disposed between the doped region and the second semiconductor layer.

According to an embodiment of the disclosure, a manufacturing method for a light emitting element may comprise forming, on an underlying substrate, a semiconductor core including a first end, a second end, and a main body part between the first end and the second end, forming a first electrode layer surrounding at least a partial region of the second end of the semiconductor core and a second electrode layer surrounding the first end and the main body part and spaced apart from the first electrode layer, and forming an insulating film surrounding the first electrode layer, the second electrode layer, and the semiconductor core and performing separation from the underlying substrate.

In the semiconductor core, a diameter of the second end may be smaller than a diameter of the main body part, and an outer surface of the second end may have a shape recessed from an outer surface of the main body part.

The forming of the first electrode layer and the second electrode layer may be performed by depositing a material of the first electrode layer and the second electrode layer on an outer surface of the semiconductor core, and the material may be not deposited between the second end and the main body part.

The forming of the semiconductor core may comprise forming a first mask layer disposed on the underlying substrate, a second mask layer disposed on the first mask layer, and an etch hole penetrating the first mask layer and the second mask layer to partially expose the underlying substrate, growing a first semiconductor layer along the etch hole and removing the second mask layer to expose a part of the first semiconductor layer, forming an active layer and a second semiconductor layer on the exposed first semiconductor layer, and removing the first mask layer.

A diameter of the etch hole of the first mask layer may be smaller than a diameter of the etch hole of the second mask layer.

The first semiconductor layer may include a first portion extending in a direction, a second portion located on a side of the first portion, and a third portion located on another side of the first portion and extending in the direction. The third portion may be growth along the etch hole of the first mask layer, and the first portion may be grown along the etch hole of the second mask layer.

According to an embodiment of the disclosure, a display device may comprise a first electrode disposed on a substrate, a second electrode disposed on the substrate and spaced apart from the first electrode, and at least one light emitting element disposed between the first electrode and the second electrode. The light emitting element may include a semiconductor core having at least a partial region extending in a direction and including a first end, a second end, and a main body part between the first end and the second end, a first electrode layer surrounding the second end of the semiconductor core, a second electrode layer surrounding at least the first end of the semiconductor core and spaced apart from the first electrode layer, and an insulating film surrounding the semiconductor core, the first electrode layer, and the second electrode layer. The second end of the semiconductor core may have a diameter smaller than that of the main body part.

The first electrode layer may be spaced apart from the main body part and surround at least a partial region of the second end, and the second electrode layer may surround the first end and the main body part.

The display device may further comprise a first contact electrode electrically contacting the first electrode and the second electrode layer, and a second contact electrode electrically contacting the second electrode and the first electrode layer.

At least a partial region of the insulating film of the light emitting element may be removed to partially expose the first electrode layer and the second electrode layer, the first contact electrode may electrically contact the exposed second electrode layer, and the second contact electrode may electrically contact the exposed first electrode layer and the second end of the semiconductor core.

The display device may include a first pixel and a second pixel, the light emitting element may include a first light emitting element disposed in the first pixel and a second light emitting element disposed in the second pixel, and a diameter of a central portion of the first light emitting element may be smaller than a diameter of a central portion of the second light emitting element.

A first light emitted from the first light emitting element may have a central wavelength band shorter than a central wavelength band of a second light emitted from the second light emitting element.

The details of other embodiments are included in the detailed description and the accompanying drawings.

The light emitting element according to an embodiment may be manufactured by growing semiconductor crystals, have a shape in which a diameter of a partial region is smaller than a diameter of another region, and include electrode layers formed to be spaced apart from each other by the same process. The electrode layers may be formed to be spaced apart from each other because a material of the electrode layer is not deposited on a region where a diameter is changed.

Accordingly, the light emitting element according to an embodiment may include electrode layers that are not directly connected to each other, and the display device may include the light emitting element so that different electrodes may be electrically connected to the electrode layers of the light emitting element.

The effects according to the embodiments are not limited by the contents exemplified above, and more various effects are included in this disclosure.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 19 is a schematic plan view of a display device according to an embodiment.

FIG. 24 is a schematic plan view illustrating a pixel of a display device according to still another embodiment.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling, and vice versa.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
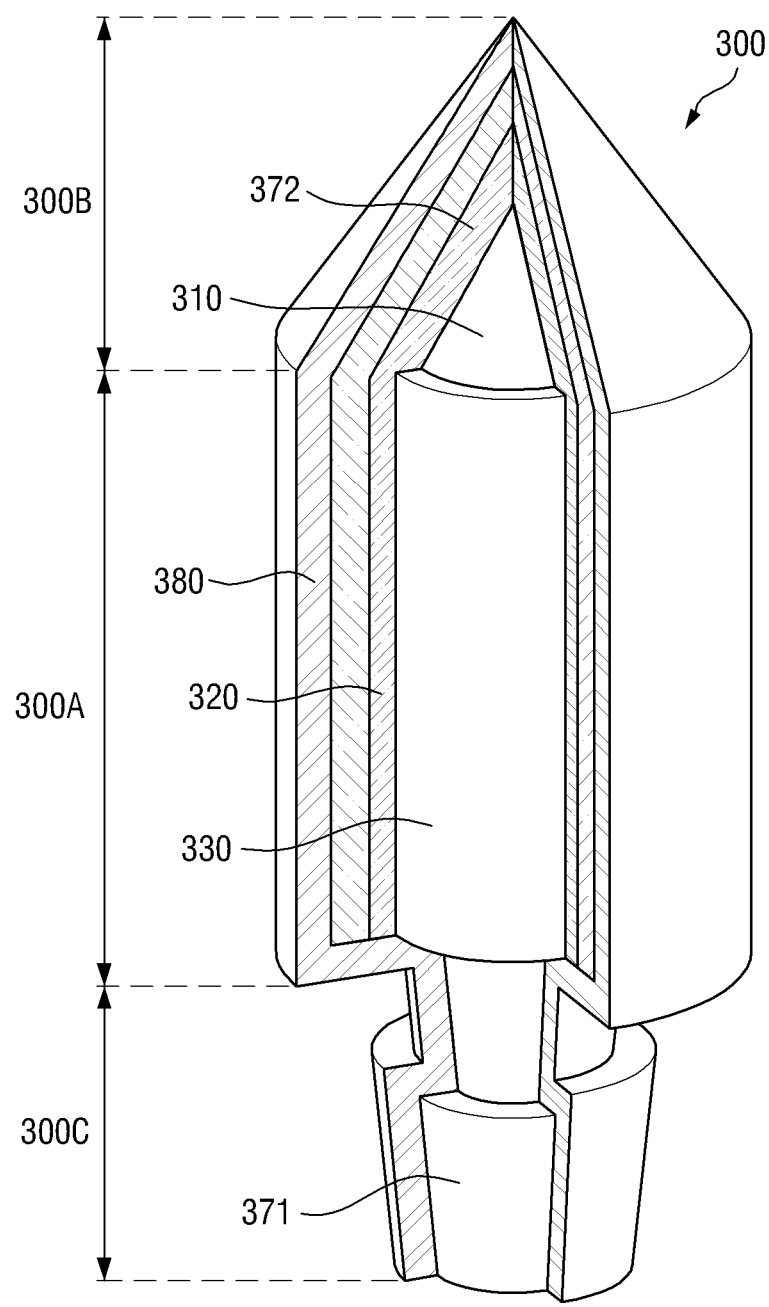
FIG. 1 is a schematic view of a light emitting element according to an embodiment.
Figure 2:
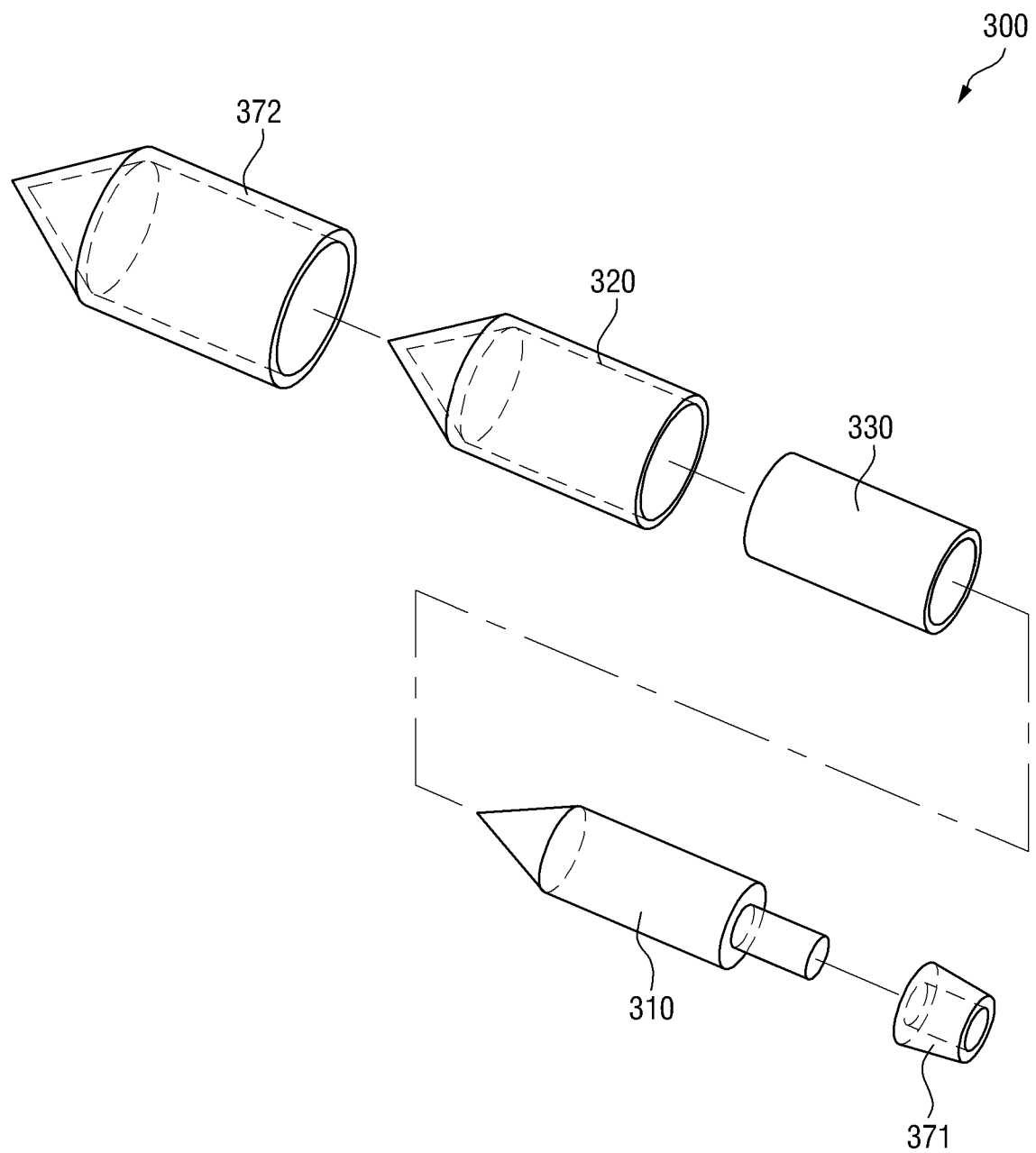
FIG. 2 is a schematic exploded perspective view of the light emitting element of FIG. 1.
Figure 3:
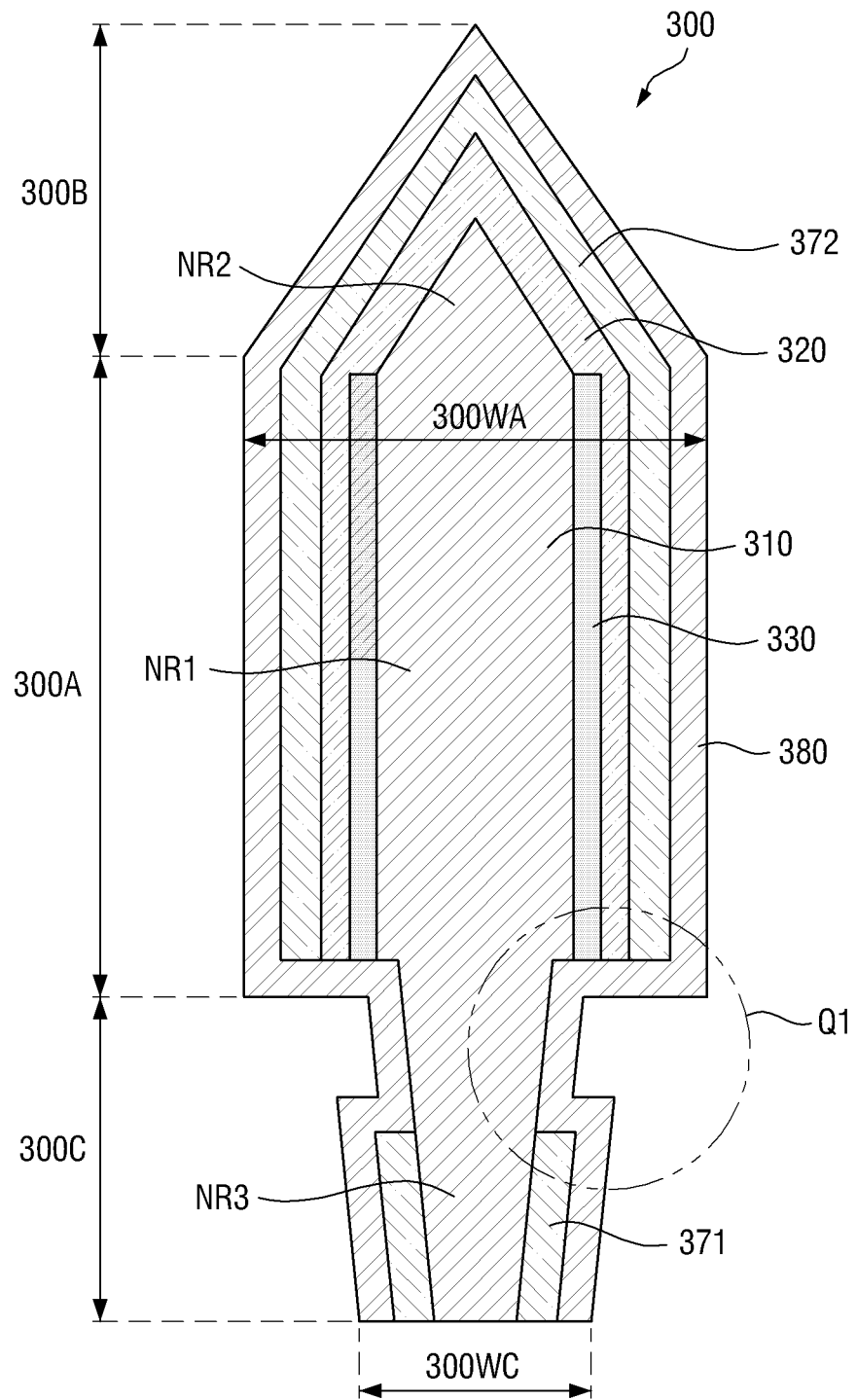
FIG. 3 is a schematic view illustrating a cross section of the light emitting element of FIG. 1.

FIG. 1 is a schematic view of a light emitting element according to an embodiment. FIG. 2 is a schematic exploded perspective view of the light emitting element of FIG. 1. FIG. 3 is a schematic view illustrating a cross section of the light emitting element of FIG. 1.

A light emitting element 300 may be a light-emitting diode (LED). The light emitting element 300 may be an inorganic light emitting diode that has a micrometer or nanometer size, and is made of an inorganic material. The inorganic light emitting diode may be aligned between two electrodes having polarity in case that an electric field is formed in a specific direction between two electrodes opposing each other. The light emitting element 300 may be aligned between two electrodes by the electric field generated between the electrodes.

The light emitting element 300 may include a semiconductor layer doped with any conductivity type (e.g., p-type or n-type) impurities. The semiconductor layer may emit light of a specific wavelength band by receiving an electrical signal applied from an external power source.

The light emitting element 300 according to an embodiment may emit light of a specific wavelength band. In an embodiment, an active layer 330 may emit blue light having a central wavelength band ranging from about 450 nm to about 495 nm. However, it should be understood that the central wavelength band of blue light is not limited to the above-mentioned range but includes all wavelength ranges that can be recognized as blue in the pertinent art. Further, the light emitted from the active layer 330 of the light emitting element 300 may not be limited thereto, and may be green light having a central wavelength band ranging from about 495 nm to about 570 nm, or red light having a central wavelength band ranging from about 620 nm to about 750 nm. Hereinafter, the description will be provided on the assumption that the light emitting element 300 emits blue light, for example.

Referring to FIGS. 1 to 3, the light emitting element 300 may include a first semiconductor layer 310, a second semiconductor layer 320, the active layer 330, a first electrode layer 371, a second electrode layer 372, and an insulating film 380.

FIG. 1 is a schematic view in which a region (or partial region) of the light emitting element 300 is cut, FIG. 2 is a schematic exploded perspective view illustrating other layers except the insulating film 380 of the light emitting element 300, and FIG. 3 is a schematic cross-sectional view taken along a direction in which the light emitting element 300 extends.

The light emitting element 300 may be formed such that semiconductor layers surround at least a part of an outer surface of any other layer. The light emitting element 300 may include a semiconductor core (310, 320, and 330) of which at least a partial region extends in a direction, electrode layers disposed at both ends of the semiconductor core, and an insulating film surrounding them. In accordance with an embodiment, in the light emitting element 300, the active layer 330, the second semiconductor layer 320, the first electrode layer 371, the second electrode layer 372, and the insulating film 380 may be sequentially disposed on the first semiconductor layer 310. The semiconductor core may include the first semiconductor layer 310, the active layer 330, and the second semiconductor layer 320.

The active layer 330 and the first electrode layer 371 may be disposed to partially surround the first semiconductor layer 310. They may directly contact the first semiconductor layer 310 and may be spaced apart from each other. The second semiconductor layer 320 may directly contact and surround the active layer 330, and the second electrode layer 372 may directly contact and surround the second semiconductor layer 320. The insulating film 380 may completely surround the outer surfaces of the first semiconductor layer 310, the first electrode layer 371, and the second electrode layer 372.

The light emitting element 300 may have a shape in which at least a partial region thereof extends in a direction. The light emitting element 300 may have a shape of a rod, wire, tube, or the like. In an embodiment, the light emitting element 300 may have a shape extending in a direction and may have a shape in which a side surface thereof is partially inclined. For example, the light emitting element 300 according to an embodiment may partially have a conical shape.

The light emitting element 300 according to an embodiment may include a main body part 300A, and a first end 300B and a second end 300C connected to (or extended to) the main body part 300A. The main body part 300A, the first end 300B, and the second end 300C are referred to in order to define the light emitting element 300 or parts of semiconductor layers constituting them, and they may be integrally formed, without being separated from each other, to form a light emitting element 300. For example, the main body part 300A, the first end 300B, and the second end 300C may distinguish and indicate partial regions of the light emitting element 300 or the semiconductor layers constituting them. The main body part 300A, the first end 300B, and the second end 300C to be described below do not necessarily indicate partial regions of the light emitting element 300 including all the semiconductor layers, and may be understood to indicate partial regions of the semiconductor core including some components, e.g., the first semiconductor layer 310, the active layer 330, the second semiconductor layer 320, and the like.

The main body part 300A of the light emitting element 300 may have a shape extending in a direction. The main body part 300A extending in a direction may have a flat outer surface in a cross-sectional view. In some embodiments, the main body part 300A may have a cylindrical shape, a rod shape, or a polygonal prism shape, but the disclosure is not limited thereto.

The first end 300B of the light emitting element 300 may be a region connected to (or extended to) a side of the main body part 300A and in which a second electrode layer 372 to be described below is located. Unlike the main body part 300A, the first end 300B may have an inclined outer surface. The inclined outer surface of the first end 300B may meet an end of the light emitting element 300, and the first end 300B may have a substantially conical shape.

In the main body part 300A and the first end 300B, the active layer 330, the second semiconductor layer 320, the second electrode layer 372, and the insulating film 380 may be sequentially arranged on the first semiconductor layer 310 disposed at the center (e.g., centers of the main body part 300A and the first end 300B). However, the disclosure is not limited thereto.

The second end 300C of the light emitting element 300 may be a region connected to (or extended to) the other side of the main body part 300A and in which the first electrode layer 371 to be described below is located. The second end 300C and the main body part 300A may have substantially a same shape and may have a shape extending with a different diameter. In accordance with an embodiment, in the light emitting element 300, a diameter 300WA of the main body part 300A may be greater than a diameter 300WC of the second end 300C. For example, the second end 300C may have a shape in which its outer surface is recessed toward the center from the outer surface of the main body part 300A. Unlike the main body part 300A of the light emitting element 300, only the first semiconductor layer 310, the first electrode layer 371, and the insulating film 380 may be disposed at the second end 300C. For example, in the main body part 300A and the second end 300C, the layers sequentially arranged from the first semiconductor layer 310 toward the outer surface of the light emitting element 300 may be different. Accordingly, the diameter 300WA of the main body part 300A may be greater than the diameter 300WC of the second end 300C. As will be described below, a portion of the first semiconductor layer 310 corresponding to the main body part 300A may have a diameter greater than that of a portion corresponding to the second end 300C. This may be a structure formed in case that the first semiconductor layer 310 grows in the manufacturing process of the light emitting element 300.

However, the shape of the light emitting element 300 is not limited thereto, and the light emitting element 300 may have various shapes such as a cylindrical shape, a rod shape, and a polygonal prism shape, e.g., a regular cube, a rectangular parallelepiped and a hexagonal prism, or the like. The semiconductor layers may have a structure in which they are sequentially arranged in a direction or stacked.

Among the layers of the light emitting element 300, the first semiconductor layer 310 may be, e.g., an n-type semiconductor having a first conductivity type. For example, in case that the light emitting element 300 emits light of a blue wavelength band, the first semiconductor layer 310 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be one or more of AlGaInN, GaN, AlGaN, InGaN, AlN and InN doped with an n-type dopant. The first semiconductor layer 310 may be doped with a first conductive dopant. For example, the first conductive dopant may be Si, Ge, Sn, or the like. In an embodiment, the first semiconductor layer 310 may be n-GaN doped with n-type Si. The length of the first semiconductor layer 310 may have a range of about 1.5 μm to about 5 μm, but the disclosure is not limited thereto.

In accordance with an embodiment, the first semiconductor layer 310 may include a first portion NR1 corresponding to the main body part 300A of the light emitting element 300, a second portion NR2 corresponding to the first end 300B, and a third portion NR3 corresponding to the second end 300C. The first portion NR1 may have a shape extending in a direction, similar to the main body part 300A of the light emitting element 300. The first portion NR1 and the main body part 300A may have substantially a same shape, but the disclosure is not limited thereto. In some embodiments, the main body part 300A may have different diameters depending on positions thereof. This will be described below with reference to another embodiment.

The second portion NR2 located at one side of the first portion NR1 may have an inclined outer surface. The second portion NR2 may extend to one side of the first portion NR1, and the side surface thereof may be inclined in a cross-sectional view to meet one end of the first semiconductor layer 310. For example, the second portion NR2 may have a conical shape, similar to the first end 300B.

The third portion NR3 may be located at the other side of the first portion NR1. The third portion NR3 may have a shape extending in one direction, similar to the first portion NR1. In accordance with an embodiment, in the first semiconductor layer 310 of the light emitting element 300, the diameter of the first portion NR1 may be greater than the diameter of the third portion NR3. As shown in the drawing, the third portion NR3 of the first semiconductor layer 310 may have a diameter smaller than that of the first portion NR1, and may have a shape in which its outer surface is recessed toward the center from the outer surface of the first portion NR1. This structure may be obtained by forming the third portion NR3 and then forming the first portion NR1 by further depositing a material of the first semiconductor layer 310, during the process of forming the first semiconductor layer 310. In case that the first semiconductor layer 310 is formed, the first portion NR1 may be formed by further growth of the semiconductor crystals only in a partial region of the semiconductor crystals extending in a direction. Furthermore, the diameter of the third portion NR3 may decrease from a region adjacent to the first portion NR1 toward the opposite region. However, the disclosure is not limited thereto.

The second semiconductor layer 320 is disposed to cover the active layer 330 to be described below and the first portion NR1 and the second portion NR2 of the first semiconductor layer 310. The second semiconductor layer 320 may be, by way of non-limiting example, a p-type semiconductor having a second conductivity type. For example, in case that the light emitting element 300 emits light of a blue or green wavelength band, the second semiconductor layer 320 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be one or more of AlGaInN, GaN, AlGaN, InGaN, AlN and InN doped with a p-type dopant. The second semiconductor layer 320 may be doped with a second conductive dopant. For example, the second conductive dopant may be Mg, Zn, Ca, Se, Ba, or the like. In an embodiment, the second semiconductor layer 320 may be p-GaN doped with p-type Mg. The thickness of the second semiconductor layer 320 may have a range of about 0.05 μm to about 0.10 μm, but the disclosure is not limited thereto.

Although FIGS. 1 to 3 illustrate that the first semiconductor layer 310 and the second semiconductor layer 320 are configured as a single layer, the disclosure is not limited thereto. According to some embodiments, depending on the material of the active layer 330, the first semiconductor layer 310 and the second semiconductor layer 320 may further include a larger number of layers such as a cladding layer or a tensile strain barrier reducing (TSBR) layer.

The active layer 330 is disposed between the first semiconductor layer 310 and the second semiconductor layer 320. The active layer 330 may be disposed to surround the first portion NR1 of the first semiconductor layer 310, and may be disposed between the first semiconductor layer 310 and the second semiconductor layer 320 at the main body part 300A of the light emitting element 300. The active layer 330 may include a quantum layer as will be described below to emit light of a specific wavelength band. The wavelength band of the light emitted from the active layer 330 may vary depending on the content of a material contained in the quantum layer. Furthermore, the content of the material contained in the quantum layer of the active layer 330 may vary depending on the lattice constant of the first semiconductor layer 310 on which the active layer 330 is disposed. The lattice constant of the first semiconductor layer 310 may vary depending on the material of the first semiconductor layer 310 or the diameter or shape of the first semiconductor layer 310.

The first semiconductor layer 310 may include the first portion NR1 having a flat outer surface in a cross-sectional view, and the second portion NR2 having an inclined outer surface and the third portion NR3 having a different diameter in a cross-sectional view. The first portion NR1, the second portion NR2, and the third portion NR3 may have different lattice constants. In case that the active layer 330 completely surrounds the first semiconductor layer 310, the content of the material contained in the quantum layer varies depending on the position of the active layer 330 and, thus, lights of different wavelength bands may be emitted. In the light emitting element 300 according to an embodiment, the active layer 330 is disposed only at the first portion NR1 of the first semiconductor layer 310 and thus includes the quantum layer having the same content of material to emit light of a constant wavelength band. Since the active layer 330 is disposed only at the first portion NR1 extending in a direction of the first semiconductor layer 310, the second portion NR2 of the first semiconductor layer 310 may contact the second semiconductor layer 320. However, the disclosure is not limited thereto, and in some embodiments, the active layer 330 may also be disposed at the second portion NR2 of the first semiconductor layer 310.

The active layer 330 may include a material having a single or multiple quantum well structure. In case that the active layer 330 includes a material having a multiple quantum well structure, quantum layers and well layers may be stacked alternately. The active layer 330 may emit light by coupling of electron-hole pairs according to an electrical signal applied through the first semiconductor layer 310 and the second semiconductor layer 320. For example, in case that the active layer 330 emits light of a blue wavelength band, the active layer 330 may include a material such as AlGaN or AlGaInN. In case that the active layer 330 has a multiple quantum well structure in which quantum layers and well layers are alternately stacked, the quantum layer may include a material such as AlGaN or AlGaInN, and the well layer may include a material such as GaN or AlInN. In an embodiment, as described above, the active layer 330 includes AlGaInN as a quantum layer and AlInN as a well layer, and the active layer 330 may emit blue light having a central wavelength band of about 450 nm to about 495 nm.

However, the disclosure is not limited thereto, and the active layer 330 may have a structure in which semiconductor materials having large band gap energy and semiconductor materials having small band gap energy are alternately stacked, and may include other group III to V semiconductor materials according to the wavelength band of emitted light. The light emitted from the active layer 330 is not limited to light of a blue wavelength band, and in some embodiments, the active layer 330 may also emit light of a red or green wavelength band. The thickness of the active layer 330 may have a range of about 0.05 μm to about 0.10 μm, but the disclosure is not limited thereto.

Light emitted from the active layer 330 may be emitted to both side surfaces as well as the outer surface of the light emitting element 300 in a longitudinal direction. The directionality of the light emitted from the active layer 330 is not limited to a direction.

The electrode layers 371 and 372 may each be an ohmic contact electrode. However, the disclosure is not limited thereto, and they may be a Schottky contact electrode. In case that the light emitting element 300 is electrically connected to an electrode or contact electrode in a display device 10 (see FIG. 19) according to an embodiment as will be described below, the electrode layers 371 and 372 are capable of reducing resistance between the light emitting element 300 and the electrode or contact electrode. The electrode layers 371 and 372 may include a conductive metal. For example, the electrode layers 371 and 372 may include at least one of aluminum (Al), titanium (Ti), indium (In), gold (Au), silver (Ag), indium tin oxide (ITO), indium zinc oxide (IZO), or indium tin zinc oxide (ITZO). Further, the electrode layers 371 and 372 may include a semiconductor material doped with an n- or p-type dopant. The electrode layers 371 and 372 may include a same material or different materials, but the disclosure is not limited thereto.

The electrode layers 371 and 372 include the first electrode layer 371 and the second electrode layer 372. In accordance with an embodiment, the first electrode layer 371 is disposed in at least a partial region of the third portion NR3 of the first semiconductor layer 310, and the second electrode layer 372 is disposed on the second semiconductor layer 320. The second electrode layer 372 may be disposed at the first end 300B of the light emitting element 300, and the first electrode layer 371 may be disposed at the second end 300C thereof.

The first electrode layer 371 may directly contact the first semiconductor layer 310 and may be disposed to surround a partial region of the third portion NR3. The third portion NR3 of the first semiconductor layer 310 may be surrounded by the first electrode layer 371 except the side surface of a lower end thereof in the drawing and a partial region of an upper end thereof adjacent to the first portion NR1.

The second electrode layer 372 may directly contact the second semiconductor layer 320, and may be disposed to surround the outer surface of the second semiconductor layer 320 corresponding to the main body part 300A and the first end 300B of the light emitting element 300. For example, the second electrode layer 372 and the second semiconductor layer 320 may have substantially a same shape.

The light emitting element 300 may receive an electrical signal through the first electrode layer 371 and the second electrode layer 372 to emit light of a specific wavelength band from the active layer 330. The first electrode layer 371 and the second electrode layer 372 may be spaced apart from each other to transmit the electrical signal to the active layer 330 through the first electrode layer 371 and the first semiconductor layer 310. In accordance with an embodiment, the first electrode layer 371 and the second electrode layer 372 may be spaced apart from each other in a direction in which the light emitting element 300 extends between the first portion NR1 and the third portion NR3 of the first semiconductor layer 310.

As illustrated in part Q1 of FIG. 3, the first electrode layer 371 may be disposed only at the third portion NR3 of the first semiconductor layer 310, and may not be disposed at the first portion NR1. The second electrode layer 372 may be disposed only in the region corresponding to the first portion NR1 and the second portion NR2 of the first semiconductor layer 310 on the second semiconductor layer 320. As described above, in the first semiconductor layer 310, the diameter of the first portion NR1 may be greater than the diameter of the third portion NR3. Accordingly, in the light emitting element 300, the diameter 300WA of the main body part 300A may be greater than the diameter 300WC of the second end 300C. The third portion NR3 of the first semiconductor layer 310 may have a shape in which its outer surface is recessed toward the center from the outer surface of the first portion NR1. As can be seen from part Q1 of FIG. 3, the material of the electrode layers 371 and 372 may not be effectively deposited on the portion where the third portion NR3 is recessed from the outer surface of the first portion NR1.

In the light emitting element 300 according to an embodiment, the first electrode layer 371 and the second electrode layer 372 may be formed by one process, and the first electrode layer 371 and the second electrode layer 372 may be spaced apart from each other between the first portion NR1 and the third portion NR3 of the first semiconductor layer 310. The electrode layer may not be formed in the region of the third portion NR3 having a width smaller than that of the first portion NR1 where the material is not effectively deposited, for example, at an upper portion of the third portion NR3 in the drawing, and the first electrode layer 371 may be disposed adjacent to a lower end of the third portion NR3 that is spaced apart from the first portion NR1. The shape of each of the first electrode layer 371 and the second electrode layer 372 may be a structure formed because the upper portion of the third portion NR3 is covered by the first portion NR1 and, thus, the material of the electrode layer is not deposited on the upper portion of the third portion NR3. A detailed description thereof will be given below.

The insulating film 380 is arranged to surround the outer surfaces of the semiconductor layers and electrode layers described above. In an embodiment, the insulating film 380 may be arranged to surround at least the outer surface of the active layer 330 and extend in an extension direction of the light emitting element 300. The insulating film 380 may function to protect the members. For example, the insulating film 380 may be formed to surround the side surfaces of the members, and one end (or first end) of the light emitting element 300 in a longitudinal direction, for example, the bottom surface of the first semiconductor layer 310, may be exposed. The insulating film 380 may be formed to surround the outer surfaces of the first electrode layer 371, the second electrode layer 372, and the first semiconductor layer 310 exposed because the first electrode layer 371 and the second electrode layer 372 are spaced apart from each other.

In the drawing, although the insulating film 380 is illustrated to extend in the longitudinal direction of the light emitting element 300 to cover the side surfaces ranging from the first electrode layer 371 to the second electrode layer 372, the disclosure is not limited thereto. The insulating film 380 may cover the active layer 330, and the outer surface of only a part of the semiconductor layers, or may cover only a part of the outer surfaces of the first electrode layer 371 and the second electrode layer 372 to partially expose the outer surface of each of the electrode layers 371 and 372. However, since the insulating film 380 is formed to surround the first electrode layer 371 and the second electrode layer 372 after they are formed by a manufacturing process for the light emitting element 300 to be described below, the insulating film 380 according to an embodiment may be disposed to surround outer side surfaces of the first electrode layer 371 and the second electrode layer 372 of the light emitting element 300.

The thickness of the insulating film 380 may have a range of about 10 nm to about 1.0 μm, but the disclosure is not limited thereto. The thickness of the insulating film 380 may be around 40 nm.

The insulating film 380 may include materials having insulating properties, for example, silicon oxide ($SiO_x$), silicon nitride ($SiN_x$), silicon oxynitride ($SiO_xN_y$), aluminum nitride (AlN), aluminum oxide ($A_2O_3$), and the like. Accordingly, it is possible to prevent an electrical short circuit that may occur in case that the active layer 330 directly contacts the electrode through which the electrical signal is transmitted to the light emitting element 300. Since the insulating film 380 protects the active layer 330 and the outer surface of the light emitting element 300, it is possible to prevent degradation in luminous efficiency.

Further, in some embodiments, the outer surface of the insulating film 380 may have an outer surface which is surface-treated. In case that the display device 10 is manufactured, the light emitting elements 300 may be aligned by being sprayed on the electrodes in a state of being dispersed in ink. The surface of the insulating film 380 may be treated to have a hydrophobic property or hydrophilic property in order to keep the light emitting element 300 in the dispersed state without being aggregated with other neighboring light emitting elements 300 in the ink.

The light emitting element 300 may have a length of about 1 μm to about 10 μm or about 2 μm to about 6 μm, and preferably about 3 μm to about 5 μm. Further, a diameter of the light emitting element 300 may have a range of about 300 nm to about 700 nm, and an aspect ratio of the light emitting element 300 may be about 1.2 to about 100. However, the disclosure is not limited thereto, and the light emitting elements 300 included in the display device 10 may have different diameters according to a difference in composition of the active layer 330. The diameter of the light emitting element 300 may have a range of about 500 nm.

The light emitting element 300 may be manufactured using an epitaxial growth method for forming a semiconductor layer by growing semiconductor crystals. The light emitting element 300 may be manufactured by performing a process of sequentially forming the first semiconductor layer 310, the active layer 330, and the second semiconductor layer 320 on an underlying substrate and forming the first electrode layer 371, the second electrode layer 372, and the insulating film 380. The light emitting element 300 may include the second electrode layer 372 disposed on the second semiconductor layer 320 in the second portion NR2 and the first electrode layer 371 disposed in the first portion NR1.

In accordance with an embodiment, the first semiconductor layer 310 may include the first portion NR1 and the third portion NR3 having a width smaller than that of the first portion NR1, and the first electrode layer 371 and the second electrode layers 372 may be formed to be spaced apart from each other by one process. In the process of forming the electrode layers 371 and 372, the material of the electrode layers 371 and 372 deposited on the second semiconductor layer 320 may not be deposited on a lower portion of the first portion NR1 of the first semiconductor layer 310. The material of the electrode layers 371 and 372 may be formed at a lower portion of the third portion NR3 without being deposited on the region where the first portion NR1 and the third portion NR3 are connected. Accordingly, the first electrode layer 371 and the second electrode layer 372 spaced apart from each other may be formed by a deposition process.

Hereinafter, a manufacturing method for the light emitting element 300 according to an embodiment will be described.

FIGS. 4 to 13 are schematic diagrams illustrating a manufacturing method for the light emitting element according to an embodiment.

The manufacturing method for the light emitting element 300 may include forming the first semiconductor layer 310, the active layer 330, and the second semiconductor layer 320; forming the first electrode layer 371 disposed on a partial region of the first semiconductor layer 310 and the second electrode layer 372 disposed on the second semiconductor layer 320; and forming the insulating film 380 surrounding the first electrode layer 371, the first semiconductor layer 310, and the second electrode layer 372. In the manufacturing method for the light emitting element 300 according to an embodiment, even if the first electrode layer 371 and the second electrode layer 372 are formed by one process, they may be formed to be spaced apart from each other on the first semiconductor layer 310.

Figure 4:
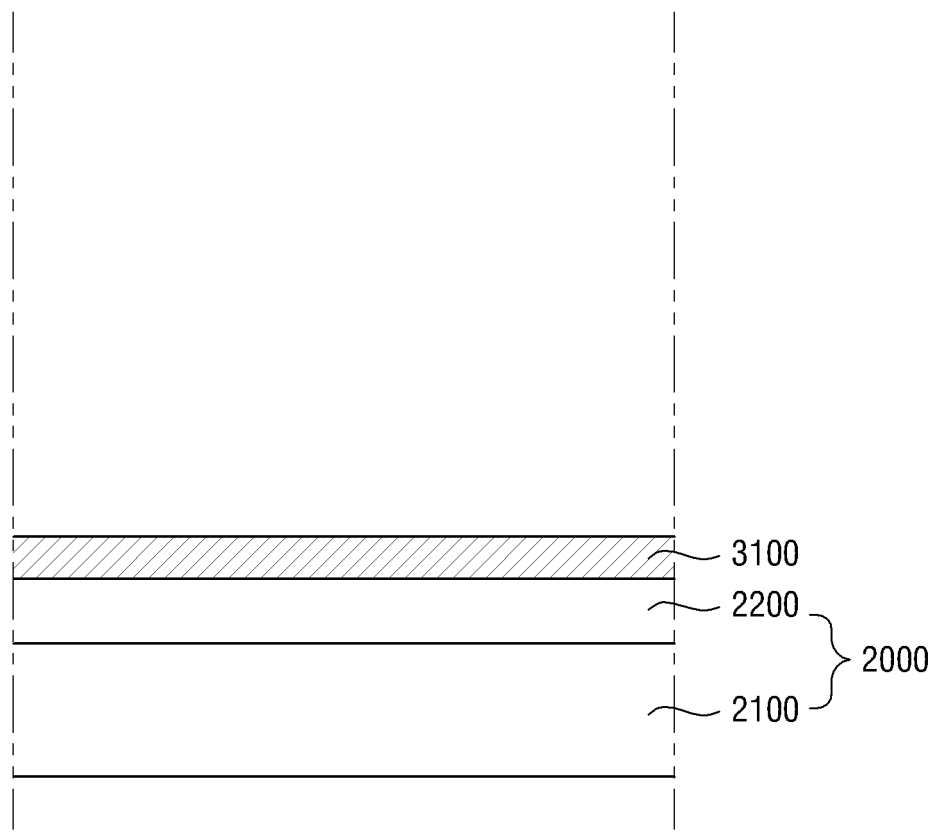
FIGS. 4 to 13 are schematic diagrams illustrating a manufacturing method for the light emitting element according to an embodiment.

Referring to FIGS. 4 to 13, the manufacturing method for the light emitting element 300 according to an embodiment will be described in detail. First, as shown in FIG. 4, an underlying substrate 2000 including a base substrate 2100 and a buffer material layer 2200 formed on the base substrate 2100, and a sub-semiconductor layer 3100 formed on the buffer material layer 2200 are prepared.

The base substrate 2100 may include a transparent substrate such as a sapphire ($Al_2O_3$) substrate and a glass substrate. However, the disclosure is not limited thereto, and it may be formed of a conductive substrate such as a GaN, SiC, ZnO, Si, GaP, and GaAs substrate. The following description is directed to a case where the base substrate 2100 is a sapphire ($Al_2O_3$) substrate. The base substrate 2100 may have, for example, a thickness in a range of about 400 μm to about 1500 μm, but the disclosure is not limited thereto.

Semiconductor layers may be formed on the base substrate 2100. The semiconductor layers grown by an epitaxial method may be formed by growing seed crystals. The semiconductor layer may be formed using at least one of electron beam deposition, physical vapor deposition (PVD), chemical vapor deposition (CVD), plasma laser deposition (PLD), dual-type thermal evaporation, sputtering, and metal organic chemical vapor deposition (MOCVD). However, the disclosure is not limited thereto.

A precursor material for forming the semiconductor layers may be selected to form a target material in a typically selectable range without any limitation. For example, the precursor material may be a metal precursor including an alkyl group such as a methyl group or an ethyl group. Examples of the precursor material may include, but are not limited to, trimethylgallium $Ga(CH_3)_3$, trimethylaluminum $Al(CH_3)_3$, and triethyl phosphate $(C_2H_5)_3PO_4$. Hereinafter, with the omission of the description of the method and processing conditions for forming the semiconductor layers, the processing order of the manufacturing method for the light emitting element 300 and the layered structure of the light emitting element 300 is described in detail.

The buffer layer 2200 is formed on the base substrate 2100. Although it is shown in the drawing that one buffer material layer 2200 is deposited, the disclosure is not limited thereto, and layers may be formed. The buffer material layer 2200 may be disposed to reduce a difference in lattice constant between a first semiconductor layer 310 and the base substrate 2100.

For example, the buffer material layer 2200 may include an undoped semiconductor and may be a material including substantially the same material as the first semiconductor layer 310 and not doped with an n- or p-type dopant. In an embodiment, the buffer material layer 2200 may be, but is not limited to, at least one of undoped InAlGaN, GaN, AlGaN, InGaN, AlN, or InN. The buffer material layer 2200 may also be omitted depending on the base substrate 2100. The following description will be given for an example where the buffer material layer 2200 including an undoped semiconductor is formed on the base substrate 2100.

The sub-semiconductor layer 3100 may be formed on the buffer material layer 2200. The sub-semiconductor layer 3100 and the first semiconductor layer 310 may include a same material. For example, the sub-semiconductor layer 3100 may include an n-type semiconductor layer. The sub-semiconductor layer 3100 may provide seed crystals of the first semiconductor layer 310 formed by the epitaxial growth method.

Figure 5:
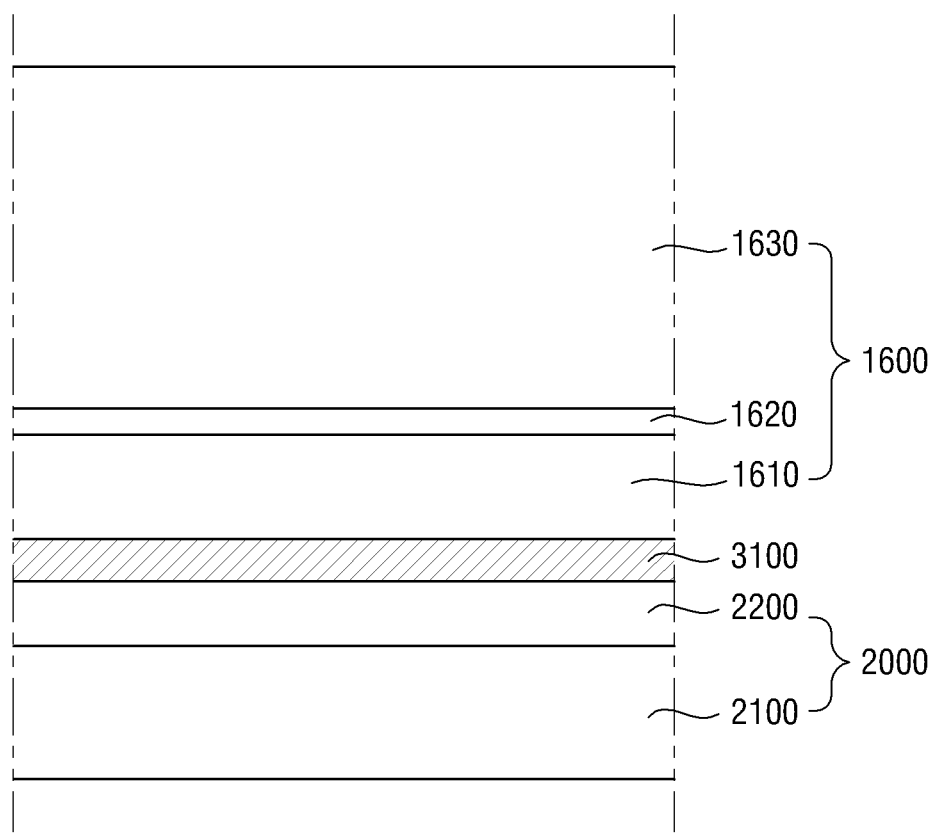
Figure 6:
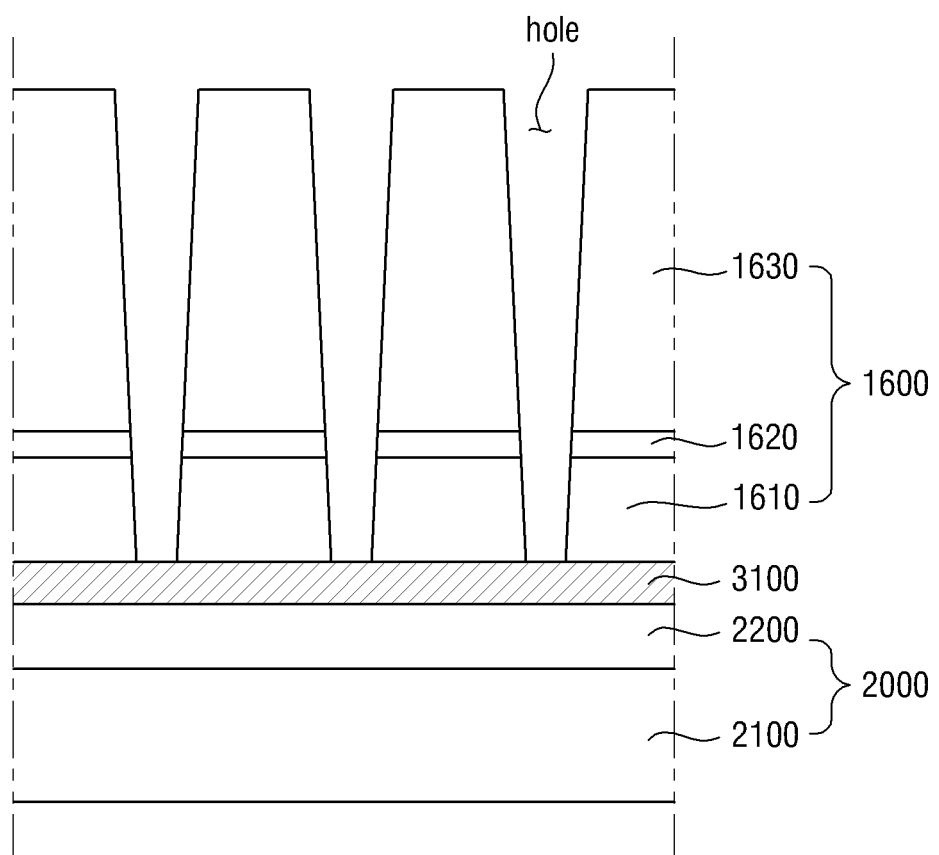

Referring to FIGS. 5 and 6, mask layers 1600 are formed on the sub-semiconductor layer 3100, and an etch hole penetrating the mask layers 1600 and exposing at least a part of the sub-semiconductor layer 3100 is formed.

The mask layer 1600 may provide a space in which the first semiconductor layer 310 grows. The etch hole exposing a part of the sub-semiconductor layer 3100 may be formed in the mask layer 1600, and the crystals of the sub-semiconductor layer 3100 that have grown through the etch hole may form the first semiconductor layer 310. In an embodiment, the mask layer 1600 may include a first mask layer 1610, a second mask layer 1620, and a third mask layer 1630. The first mask layer 1610 may be formed on the sub-semiconductor layer 3100, and the second mask layer 1620 and the third mask layer 1630 may be sequentially formed thereon.

A portion in which the sub-semiconductor layer 3100 has grown through the first mask layer 1610 and the second mask layer 1620 may be the third portion NR3 of the first semiconductor layer 310. The shape of the third portion NR3 may be substantially the same as the shape of the etch hole formed in the first mask layer 1610 and the second mask layer 1620. As will be described below, the etch hole formed in the first mask layer 1610 and the second mask layer 1620 may have a small width. Accordingly, the first semiconductor layer 310 may have a shape in which the third portion NR3 extends in one direction with a width smaller than that of the first portion NR1.

Further, in some embodiments, the first mask layer 1610 and the second mask layer 1620 may be formed to have predetermined thicknesses in order to allow the third portion NR3 of the first semiconductor layer 310 to have a specific length. The first mask layer 1610 may be thicker than the second mask layer 1620, and the overall thickness thereof may be about 300 nm or more. However, the disclosure is not limited thereto.

A portion in which the sub-semiconductor layer 3100 has grown through the third mask layer 1630 may be the first portion NR1 and the second portion NR2 of the first semiconductor layer 310. However, the first portion NR1 and the second portion NR2 of the first semiconductor layer 310 may be formed by further depositing the material of the first semiconductor layer 310 by a subsequent process, and may have a shape different from the shape of the etch hole formed in the third mask layer 1630. Accordingly, the diameter of the third portion NR3 of the first semiconductor layer 310 may be different from those of the first portion NR1 and the second portion NR2.

The materials of the first mask layer 1610, the second mask layer 1620, and the third mask layer 1630 are not particularly limited. In some embodiments, the first mask layer 1610, the second mask layer 1620, and the third mask layer 1630 may contain any of silicon oxide ($SiO_x$), silicon nitride ($SiN_x$), and silicon oxynitride ($SiO_xN_y$). For example, the first mask layer 1610 and the third mask layer 1630 may contain silicon oxide ($SiO_x$), and the second mask layer 1620 may contain silicon nitride ($SiN_x$). However, the disclosure is not limited thereto.

The etch hole may penetrate the third mask layer 1630, the second mask layer 1620, and the first mask layer 1610 to expose at least a partial region of the sub-semiconductor layer 3100. The first semiconductor layer 310 may be formed by crystal growth of the sub-semiconductor layer 3100 grown through the etch hole.

Etch holes may be formed in the mask layer 1600 to be spaced apart from each other. The gap between and the diameter of the etch holes are not particularly limited. The diameter of the portion of the sub-semiconductor layer 3100 exposed by the etch hole may be smaller than the gap between the etch holes. In some embodiments, a ratio of the diameter of the portion of the sub-semiconductor layer 3100 exposed by the etch hole to the gap between the etch holes may be about 1:2.5 to about 1:3.

In an embodiment, the inner sidewall of the mask layer 1600 exposed by the etch hole may be formed to be inclined from the top surface of the sub-semiconductor layer 3100. For example, the diameter of the etch hole may decrease from the third mask layer 1630 toward the first mask layer 1610. Accordingly, the outer surface of the first semiconductor layer 310 formed along the etch hole may be formed to be inclined. Furthermore, in the first semiconductor layer 310, the diameters of the first portion NR1 and the second portion NR2 may be greater than that of the third portion NR3, and the electrode layers 371 and 372 formed by a subsequent process may be formed only in a region of the first semiconductor layer 310. Since the third portion NR3 and the first portion NR1 of the first semiconductor layer 310 have different diameters, the material of the electrode layers 371 and 372 may not be deposited on a region where the third portion NR3 and the first portion NR1 are connected (or extended to each other), and the first electrode layer 371 and the second electrode layer 372 may be spaced apart from each other. A description thereof will be given below.

The process of forming the etch hole is not particularly limited, and may be performed by a conventional process. For example, the process of forming the etch hole may be dry etching, wet etching, reactive ion etching (RIE), inductively coupled plasma reactive ion etching (ICP-RIE), or the like. The dry etching may be suitable for vertical etching as it enables anisotropic etching. In the case of using the aforementioned etching technique, it may be possible to use $Cl_2$ or $O_2$ as an etchant. However, the disclosure is not limited thereto.

In some embodiments, the process of forming the etch hole may be performed by combining the dry etching and the wet etching. For example, it may be possible to perform etching in a depth direction by the dry etching and then to perform anisotropic etching, which is a wet etching, such that the etched sidewalls are placed on the plane perpendicular to the surface.

Figure 7:
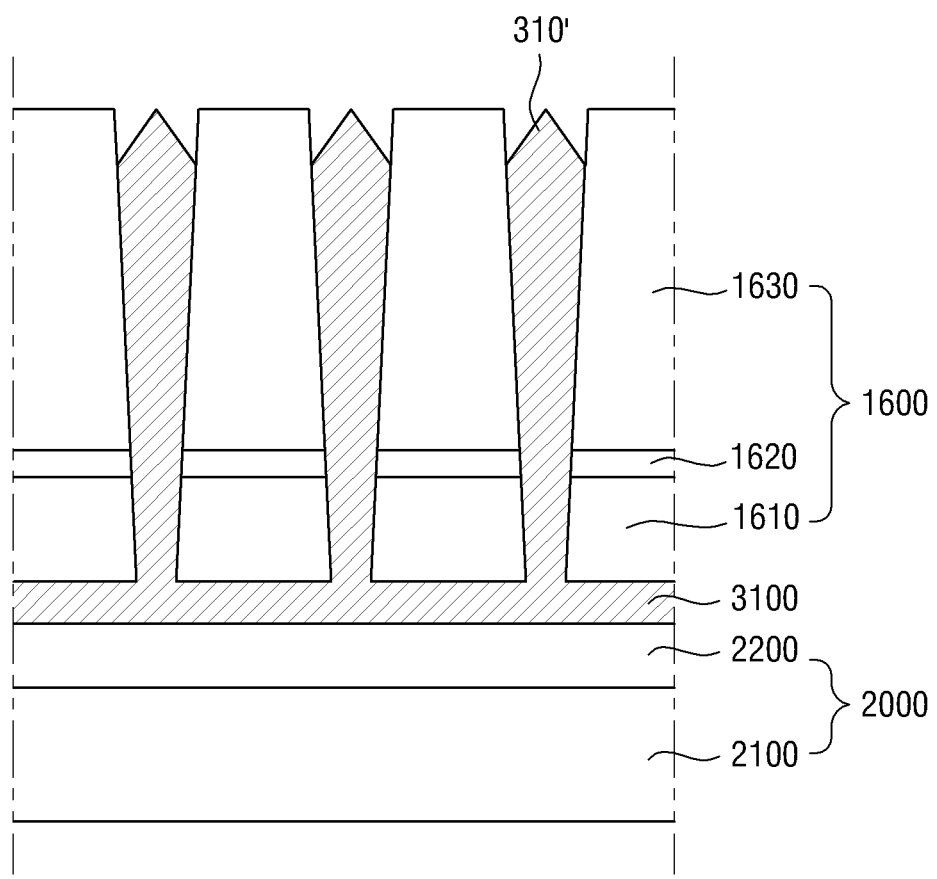
Figure 8:
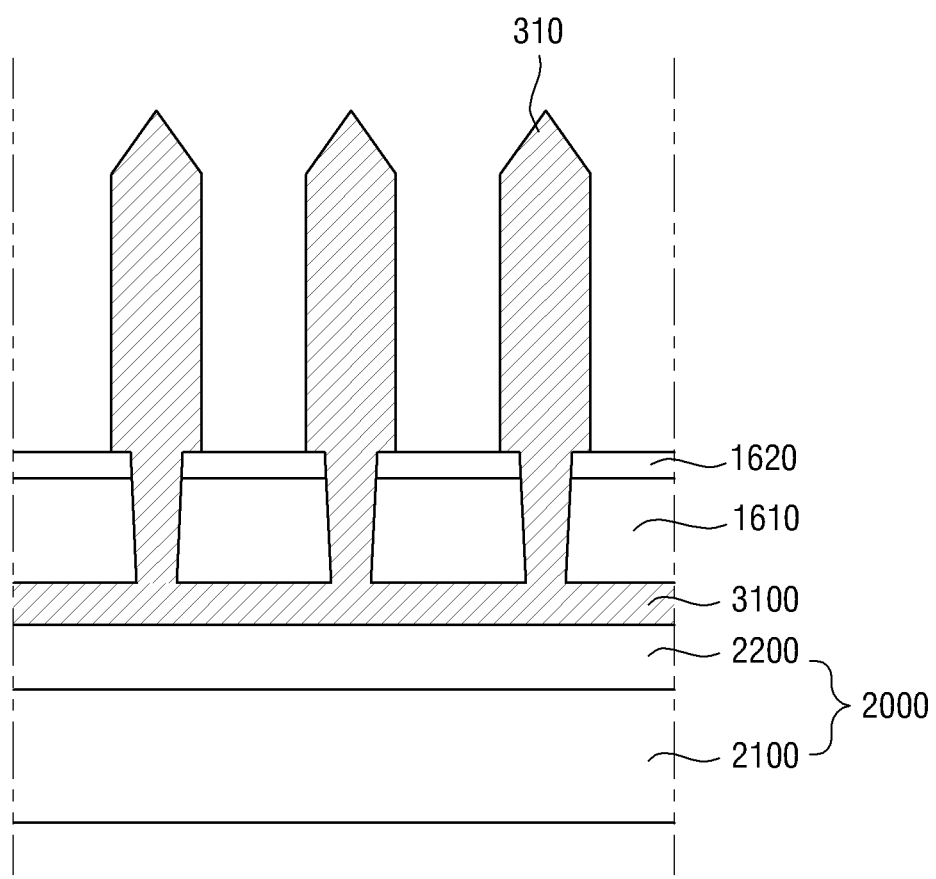

Referring to FIGS. 7 and 8, the first semiconductor layer 310 that has grown along the etch hole from the sub-semiconductor layer 3100 is formed. The process of forming the first semiconductor layer 310 includes forming a first sub-semiconductor layer 310' by growing semiconductor crystals of the sub-semiconductor layer 3100, and forming the first semiconductor layer 310 by removing the third mask layer 1630 and depositing a semiconductor material on the first sub-semiconductor layer 310'. The process of removing the third mask layer 1630 may be performed by a conventional process. For example, the above process may be reactive ion etching (RIE), inductively coupled plasma reactive ion etching (ICP-RIE), or the like, but the disclosure is not limited thereto. A detailed description thereof will be omitted.

First, as shown in FIG. 7, the first sub-semiconductor layer 310' is formed by growing semiconductor crystals of the sub-semiconductor layer 3100 along the etch hole of the mask layer 1600. The first sub-semiconductor layer 310' may have a shape in which the side surface thereof is inclined to correspond to the shape of the etch hole. For example, the width of the first sub-semiconductor layer 310' may increase from a lower end thereof where the first mask layer 1610 is located toward an upper end thereof where the third mask layer 1630 is located. However, an end portion in the growth direction of the semiconductor crystals, for example, the region of the first semiconductor layer 310 forming the second portion NR2, may have a conical shape as its width decreases.

As shown in FIG. 8, the first semiconductor layer 310 is formed by removing the third mask layer 1630 and further depositing the material of the first semiconductor layer 310. The material of the first semiconductor layer 310 may be deposited only on a region exposed by removing the third mask layer 1630, and may not be deposited on a region surrounded by the first mask layer 1610 and the second mask layer 1620. Accordingly, the first semiconductor layer 310 may include the third portion NR3 having a relatively small width, and the first portion NR1 and the second portion NR2 having a large width.

Figure 9:
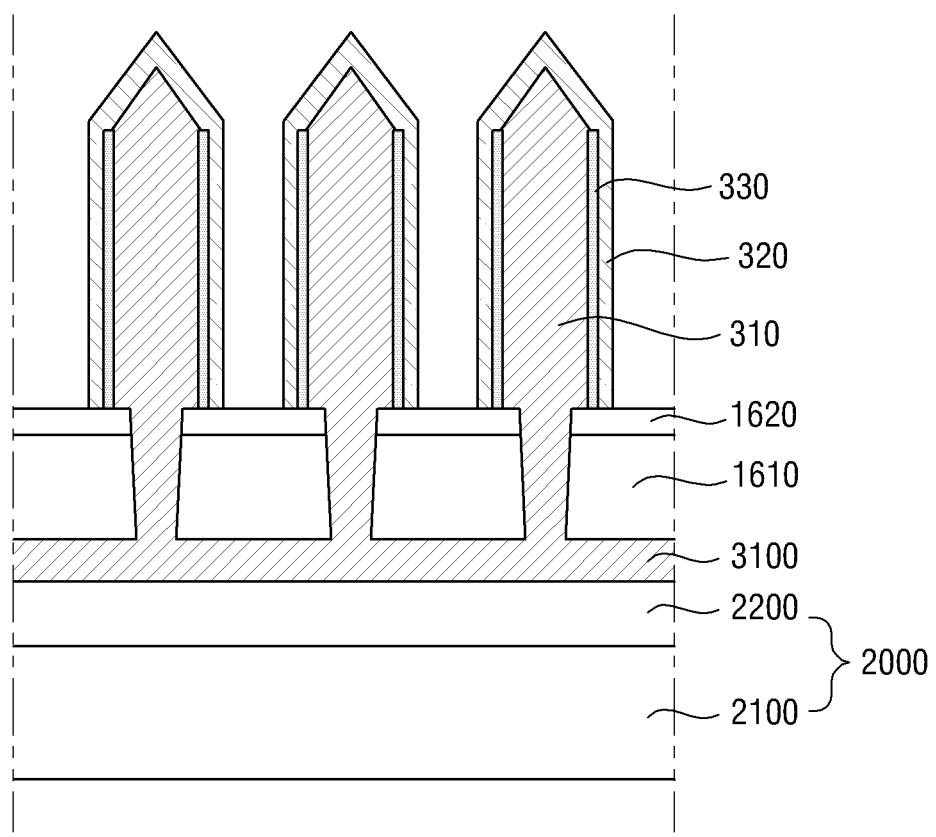

Referring to FIG. 9, the active layer 330 and the second semiconductor layer 320 are formed on the exposed first portion NR1 and the exposed second portion NR2 of the first semiconductor layer 310. The active layer 330 may be formed to surround the first portion NR1 of the first semiconductor layer 310, and the second semiconductor layer 320 may be formed to completely surround the active layer 330 and the exposed outer surface of the first semiconductor layer 310. Since the third portion NR3 of the first semiconductor layer 310 is surrounded by the first mask layer 1610 and the second mask layer 1620 without being exposed, the active layer 330 and the second semiconductor layer 320 may not be formed at the third portion NR3. The shapes thereof are the same as the above-described shapes.

Figure 10:
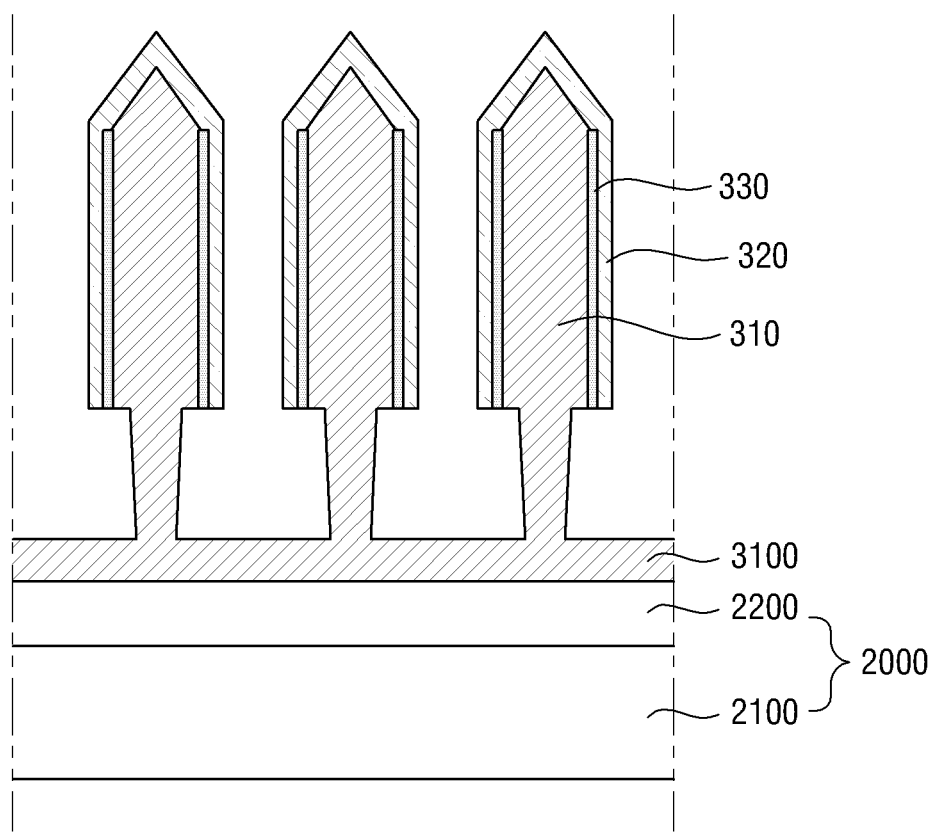

Referring to FIG. 10, the first mask layer 1610 and the second mask layer 1620 are removed to expose the third portion NR3 of the first semiconductor layer 310. The process of removing the first mask layer 1610 and the second mask layer 1620 may be performed by the conventional process as described above.

Figure 11:
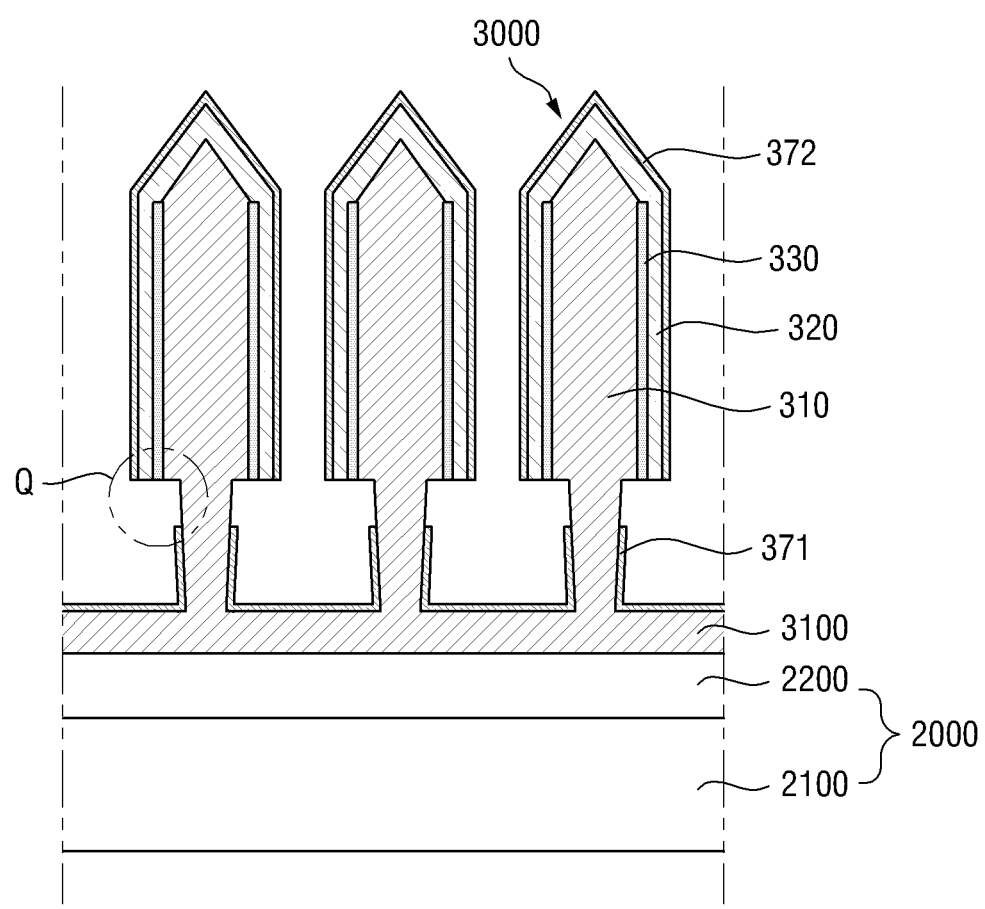

Referring to FIG. 11, a semiconductor crystal 3000 is formed by forming the first electrode layer 371 on a region of the first semiconductor layer 310 and forming the second electrode layer 372 on the second semiconductor layer 320. The semiconductor crystal 3000 may be a structure formed on the sub-semiconductor layer 3100 in a state where the first electrode layer 371, the second electrode layer 372, and a region of the first semiconductor layer 310 are exposed before the formation of the insulating film 380 in the light emitting element 300 of FIG. 1. The process of forming the first electrode layer 371 and the second electrode layer 372 may be performed by a conventional process of depositing the material of the electrode layer. However, the disclosure is not limited thereto, and detailed descriptions thereof will be omitted.

The second electrode layer 372 may be formed on the second semiconductor layer 320 and may be disposed to substantially surround the outer surface of the second semiconductor layer 320. In case that the process of depositing the material of the electrode layer on the sub-semiconductor layer 3100 is performed, the second electrode layer 372 may be formed on the exposed outer surface of the second semiconductor layer 320, for example, the outer surface of the second semiconductor layer 320 formed on the first portion NR1 and the second portion NR2 of the first semiconductor layer 310.

However, as described above, the third portion NR3 of the first semiconductor layer 310 may extend with a width smaller than that of the first portion NR1, and may have a shape in which the outer surface of the third portion NR3 has a shape recessed toward the center from the first portion NR1. Here, in case that the material of the electrode layer is deposited on the sub-semiconductor layer 3100, the material may not be deposited on the upper portion of the third portion NR3, for example, the portion connected (or extended) to the first portion NR1. The region of the third portion NR3 of the first semiconductor layer 310 that is adjacent to the first portion NR1 is recessed toward the center from the outer surface of the first portion NR1 and thus is covered by the outer surface, and the materials of the electrode layer may not be deposited on the above region.

In accordance with an embodiment, in the manufacturing process of the light emitting element 300, the first electrode layer 371 and the second electrode layer 372 may be simultaneously formed by one process, and may be formed to be spaced apart from each other. The first semiconductor layer 310 includes the third portion NR3 that has grown through the etch hole of the first mask layer 1610 and the second mask layer 1620 having predetermined thicknesses and extends with a small width. The upper portion of the third portion NR3 may be covered by the first portion NR1 having a large width, and the material of the electrode layer may not be effectively deposited thereon.

As can be seen from part Q of FIG. 11, the material of the electrode layer may not be deposited on the region of the third portion NR3 that is adjacent to the first portion NR1. Some of the materials may be deposited on the outer surface of the second semiconductor layer 320 to form the second electrode layer 372. Further, some other materials may be deposited on the lower end of the third portion NR3 of the first semiconductor layer 310 and on the sub-semiconductor layer 3100 where the first semiconductor layers 310 are spaced apart from each other. The materials deposited on the lower end of the third portion NR3 of the first semiconductor layer 310 may form the first electrode layer 371. The first electrode layer 371 and the second electrode layer 372 may be spaced apart from each other at part Q of FIG. 11, for example, in a partial region of the third portion NR3 where the third portion NR3 is connected (or extended) to the first portion NR1. The material of the electrode layer may be deposited in a direction parallel to a direction in which the light emitting element 300 extends or a direction in which the first semiconductor layers 310 are spaced apart from each other, and the first electrode layer 371 and the second electrode layer 372 may be spaced apart from each other in the direction.

In the manufacturing method for the light emitting element 300 according to an embodiment, the first electrode layer 371 and the second electrode layer 372 spaced from each other may be formed by a deposition process. In an embodiment, the first electrode layer 371 and the second electrode layer 372 may have a same thickness, but the disclosure is not limited thereto. In some embodiments, the thickness of the first electrode layer 371 may increase as a distance from the region covered by the first portion NR1 increases. This will be described below with reference to another embodiment.

Figure 12:
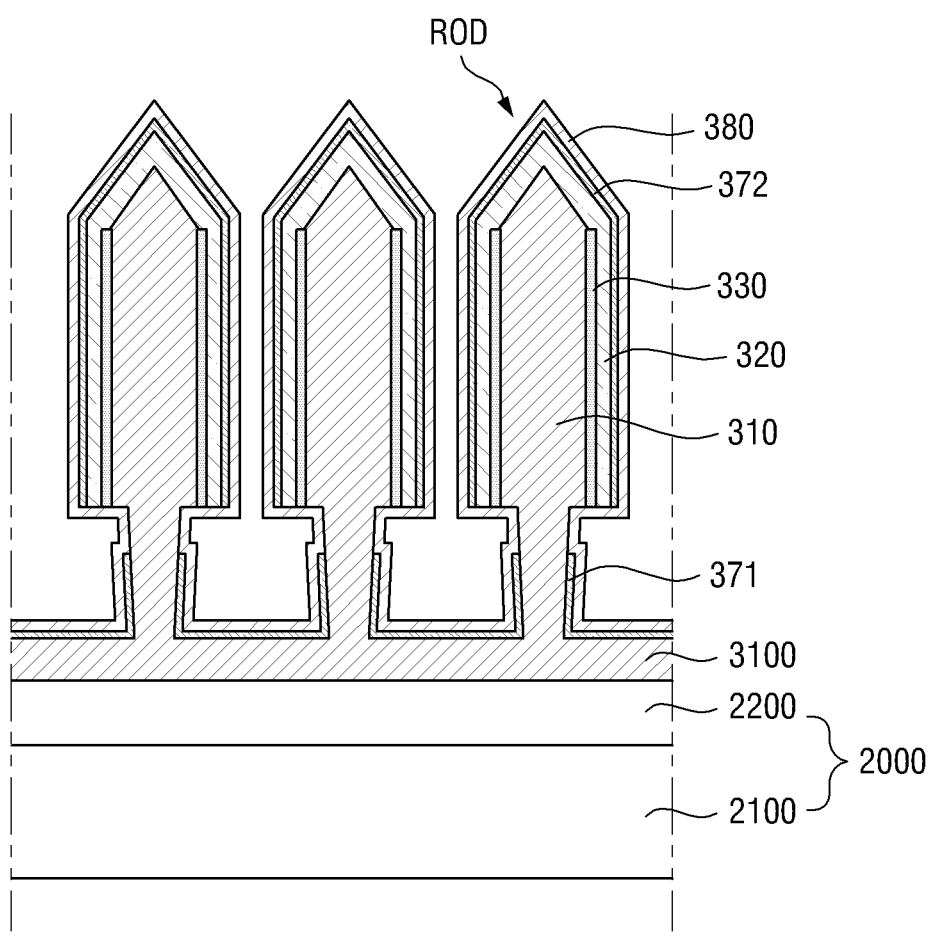

Referring to FIG. 12, the insulating film 380 surrounding the outer surface of the semiconductor crystal 3000 is formed to form a semiconductor rod ROD. The semiconductor rod ROD may indicate the light emitting element 300 of FIG. 1 that is not separated from the sub-semiconductor layer 3100.

The insulating film 380 may be formed to surround the outer surface of the semiconductor crystal 3000. The insulating film 380 may be formed using a method of immersing or coating an insulating material on the outer surface of the semiconductor crystal 3000. For example, the insulating film 380 may be formed using atomic layer deposition (ALD). Unlike the first electrode layer 371 and the second electrode layer 372, the insulating film 380 may be formed in the region where the first portion NR1 and the third portion NR3 of the first semiconductor layer 310 are connected (or extended to each other). However, the disclosure is not limited thereto.

Further, the insulating film 380 may be formed on the first electrode layer 371 formed on the sub-semiconductor layer 3100. The first electrode layer 371 and the insulating film 380 formed on the sub-semiconductor layer 3100 remain on the sub-semiconductor layer 3100 in case that the semiconductor rod ROD is separated from the sub-semiconductor layer 3100 by a subsequent process.

Figure 13:
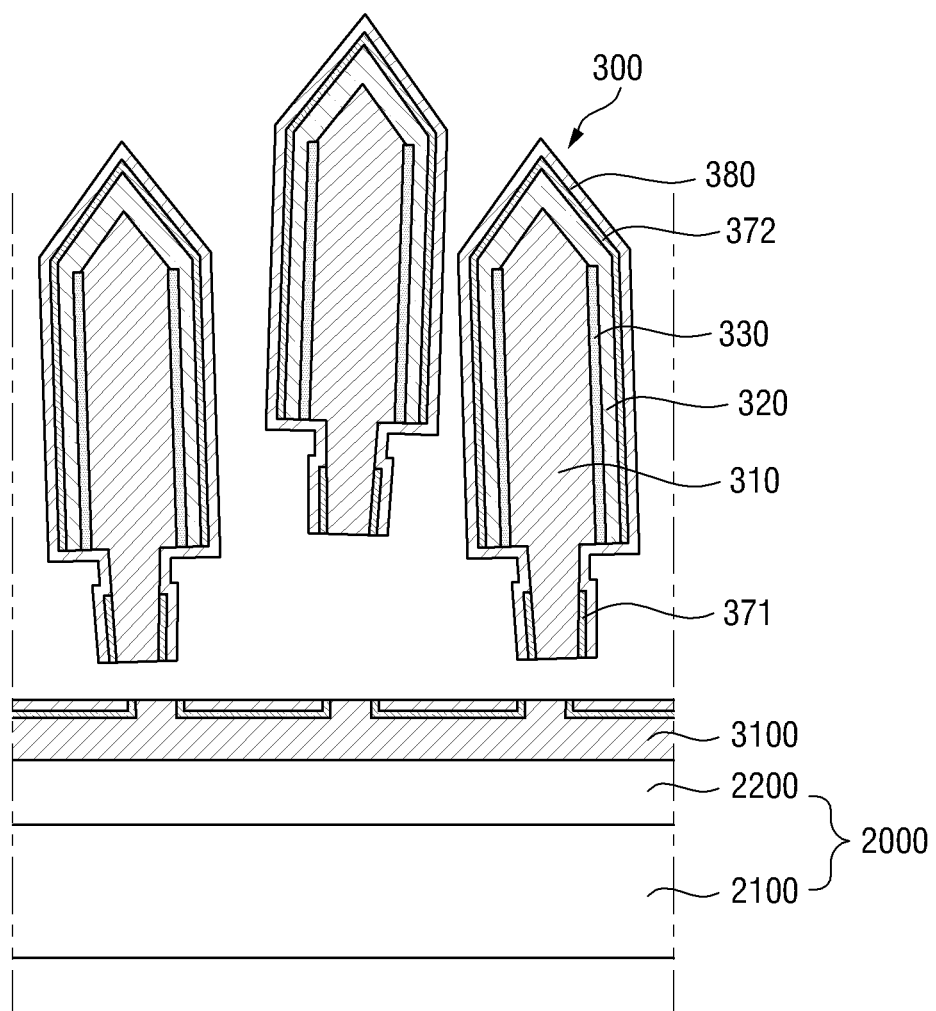

Finally, as shown in FIG. 13, the light emitting element 300 is manufactured by separating the semiconductor rod ROD that has grown on the sub-semiconductor layer 3100. The step of separating the semiconductor rod ROD is not particularly limited, and may be executed, in some embodiments, by a physical separation method using ultrasonic waves. Detailed descriptions thereof will be omitted.

By the above-described processes, the light emitting element 300 according to an embodiment may be manufactured. In the manufacturing method for the light emitting element 300, the first electrode layer 371 and the second electrode layer 372 spaced from each other may be formed by a deposition process. In the process of forming the first semiconductor layer 310, the third portion NR3 is formed along the etch hole formed in the first mask layer 1610 and the second mask layer 1620 having the predetermined thicknesses, and the first portion NR1 having a width greater than that of the third portion NR3 is formed by a subsequent process, so that the upper portion of the third portion NR3 may have a region covered by the first portion NR1. The material of the electrode layer is not effectively deposited on the above region, and the first electrode layer 371 and the second electrode layer 372 spaced apart from each other with the above region therebetween may be formed by one process.

Hereinafter, the light emitting element 300 according to other embodiments will be described.

Figure 14:
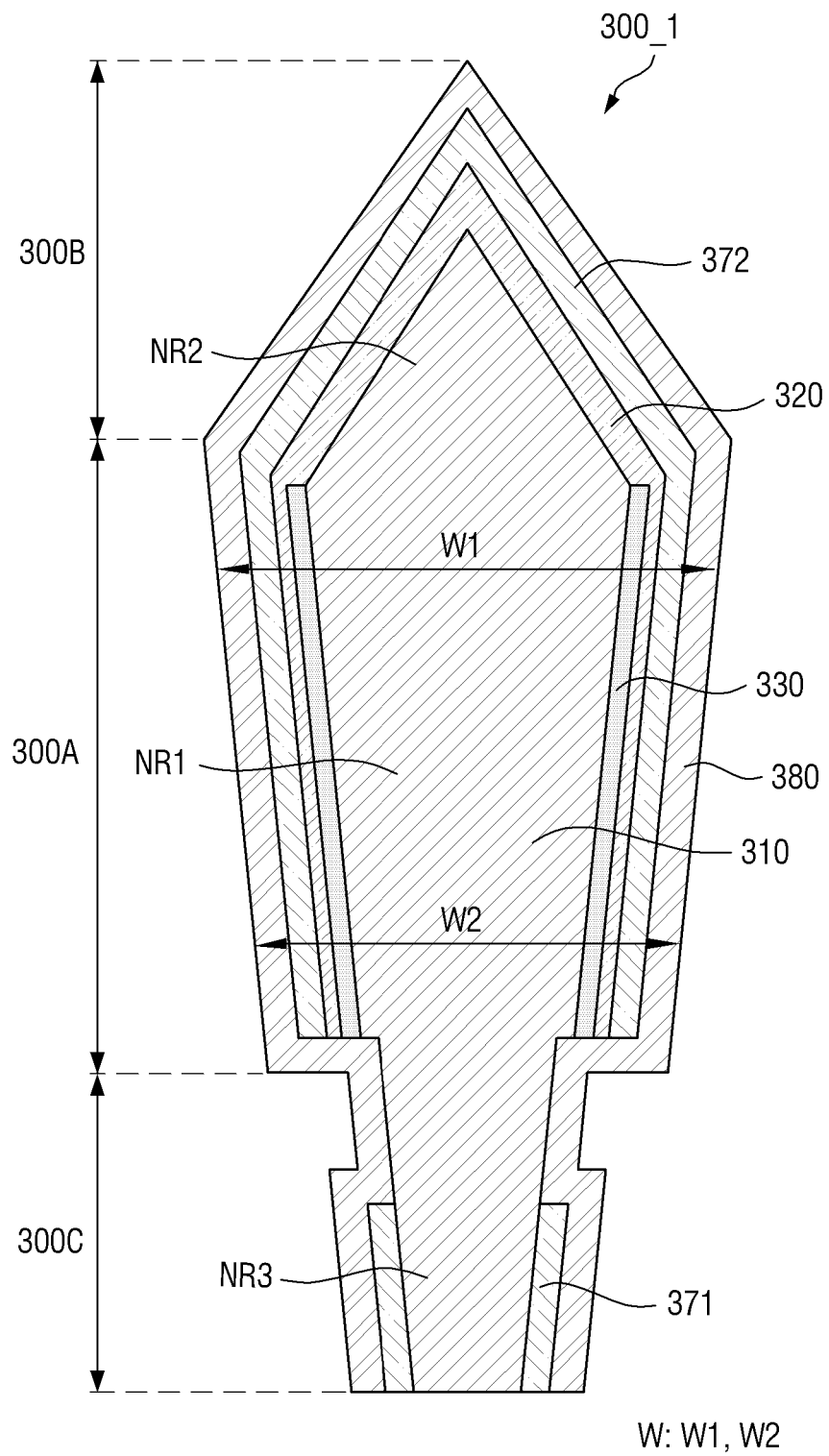
FIG. 14 is a schematic cross-sectional view of a light emitting element according to another embodiment.

FIG. 14 is a schematic cross-sectional view of a light emitting element according to another embodiment.

Referring to FIG. 14, in accordance with the embodiment, in a light emitting element 300_1, the diameter of the main body part 300A may decrease from the first end 300B toward the second end 300C. For example, in the light emitting element 300_1, a first diameter W1 of the main body part 300A adjacent to the first end 300B may be greater than a second diameter W2 of the main body part 300A adjacent to the second end 300C. The light emitting element 300_1 of FIG. 14 is different from the light emitting element 300 of FIG. 1 at least in that a diameter W varies depending on positions of the main body part 300A. The arrangements and structures of the first semiconductor layer 310, the active layer 330, and the second semiconductor layer 320 are the same as those in FIG. 1. In the following description, repetitive descriptions thereof will be omitted while focusing on differences.

In accordance with the embodiment, the diameter W of the main body part 300A of the light emitting element 300_1 may increase from the region connected (or extended) to the second end 300C toward the region extended to the first end 300B. In the manufacturing process of the light emitting element 300_1, a first semiconductor layer 310_1 may be formed by growth of a material of the sub-semiconductor layer 3100 through the etch hole. The etch hole penetrating the mask layer 1600 and exposing a partial region of the sub-semiconductor layer 3100 may be formed such that the inner wall of the mask layer 1600 is inclined. The diameter of the first semiconductor layer 310_1 that has grown along the inclined inner wall may increase from the region of the first portion NR1 that is adjacent to the sub-semiconductor layer 3100, for example, the region adjacent to the third portion NR3, toward the second portion NR2. Thereafter, even if the side surface of the first part NR1 is flattened by depositing the material of the first semiconductor layer 310_1, the first semiconductor layer 310_1 that has grown along the etch hole may have an inclined side surface. Accordingly, in the light emitting element 300_1 of FIG. 14, the first diameter W1 of the main body part 300A may be greater than the second diameter W2 of the main body part 300A adjacent to the second end 300C.

Figure 15:
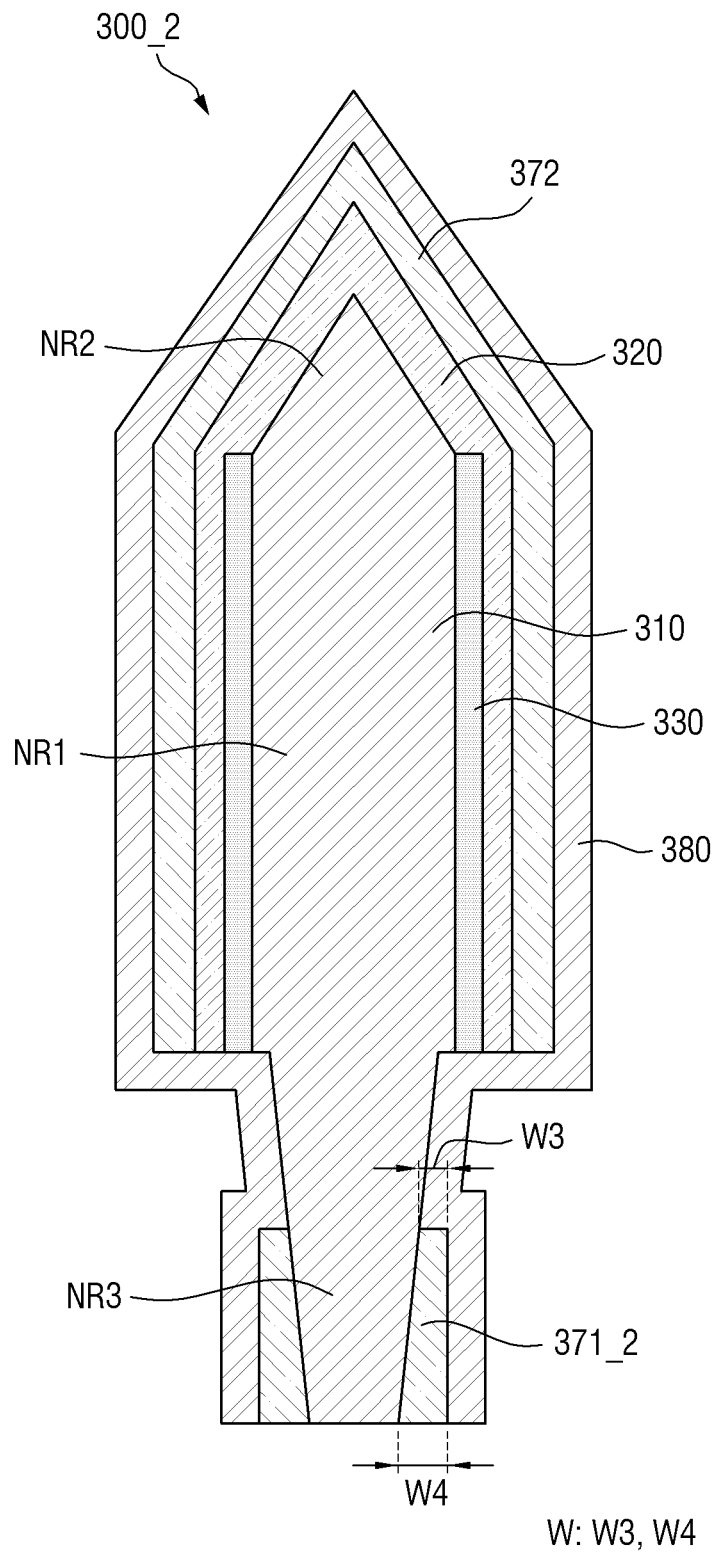
FIG. 15 is a schematic cross-sectional view of a light emitting element according to still another embodiment.

FIG. 15 is a schematic cross-sectional view of a light emitting element according to still another embodiment.

In the process of forming the first electrode layer 371 during the manufacturing process of the light emitting element 300, the first electrode layer 371 and the second electrode layer 372 may be simultaneously formed by one process. The third portion NR3 of the first semiconductor layer 310 on which the first electrode layer 371 is formed may have the upper portion covered by the first portion NR1, and the first electrode layer 371 may be formed at the lower end of the third portion NR3, for example, at the second end 300C of the light emitting element 300. The region of the first electrode layer 371 covered by the first portion NR1 and the region distant therefrom may have different thicknesses.

Referring to FIG. 15, in a light emitting element 300_2 according to the embodiment, the thickness of a first electrode layer 371_2 may not be constant. In the first electrode layer 371_2 of the light emitting element 300_2, a first thickness W3 that is the thickness of a side adjacent to the upper portion of the third portion NR3 may be smaller than a second thickness W4 that is the thickness of another side adjacent to the lower end of the third portion NR3. The light emitting element 300_2 according to the embodiment is different from the light emitting element 300 of FIG. 1 at least in that the thickness of the first electrode layer 371_2 varies depending on positions. In the following description, repetitive descriptions thereof will be omitted while focusing on differences.

In the process of forming the first electrode layer 371_2 of the light emitting element 300_2 of FIG. 15, the material of the electrode layer may not be effectively deposited on the upper portion of the third portion NR3 covered by the first portion NR1. On the other hand, the deposition of the material may be relatively effectively performed at the lower end of the third portion NR3 as a distance from the first portion NR1 increases. Accordingly, in case that the first electrode layer 371_2 is formed on the third portion NR3 of the first semiconductor layer 310_2, the first electrode layer 371_2 may have different thicknesses depending on the deposition of the material of the electrode layer. The first electrode layer 371_2 may have a side in which the deposition is not effectively performed and which has a small thickness and another side in which the deposition is effectively performed and which has a large thickness. The first thickness W3 of the side may be smaller than the second thickness W4 of the other side.

Figure 16:
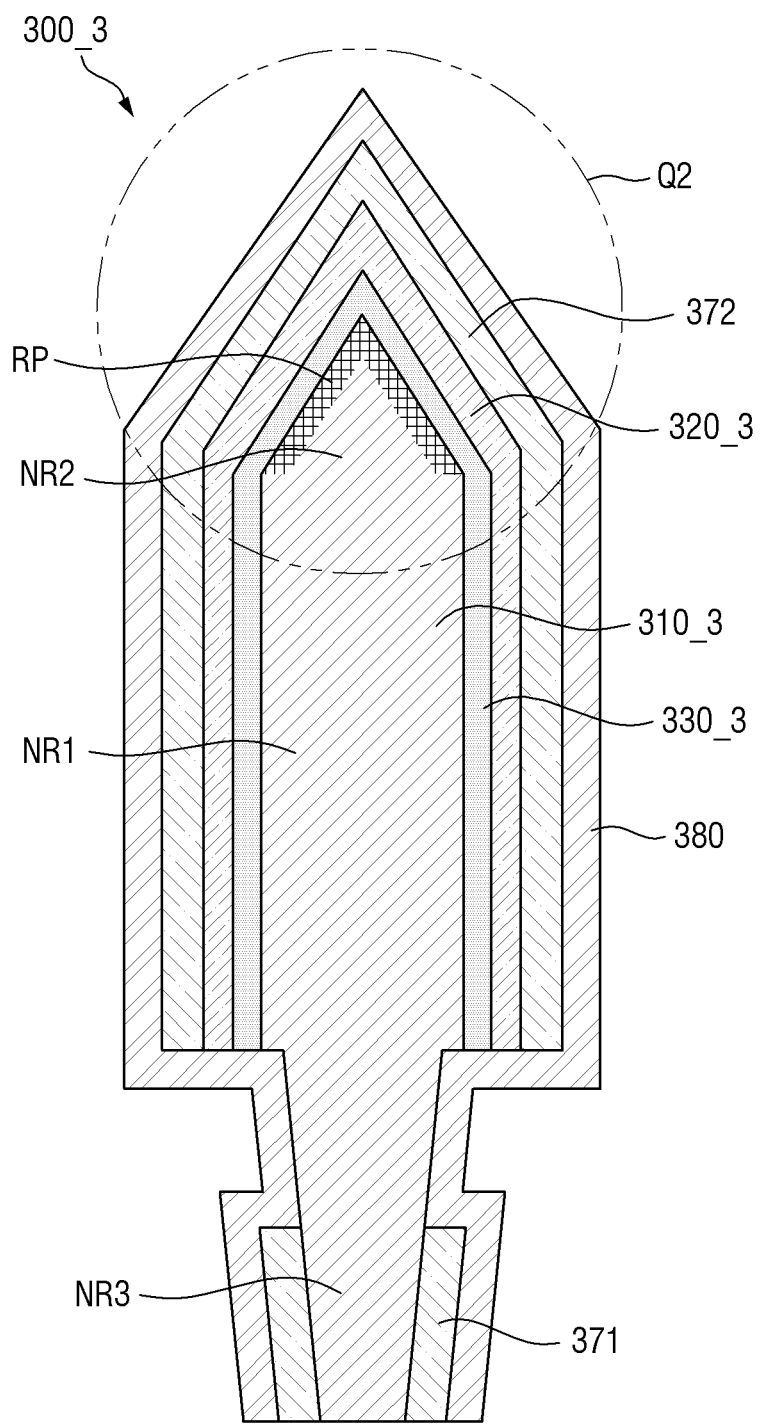
FIG. 16 is a schematic cross-sectional view of a light emitting element according to still another embodiment.
Figure 17:
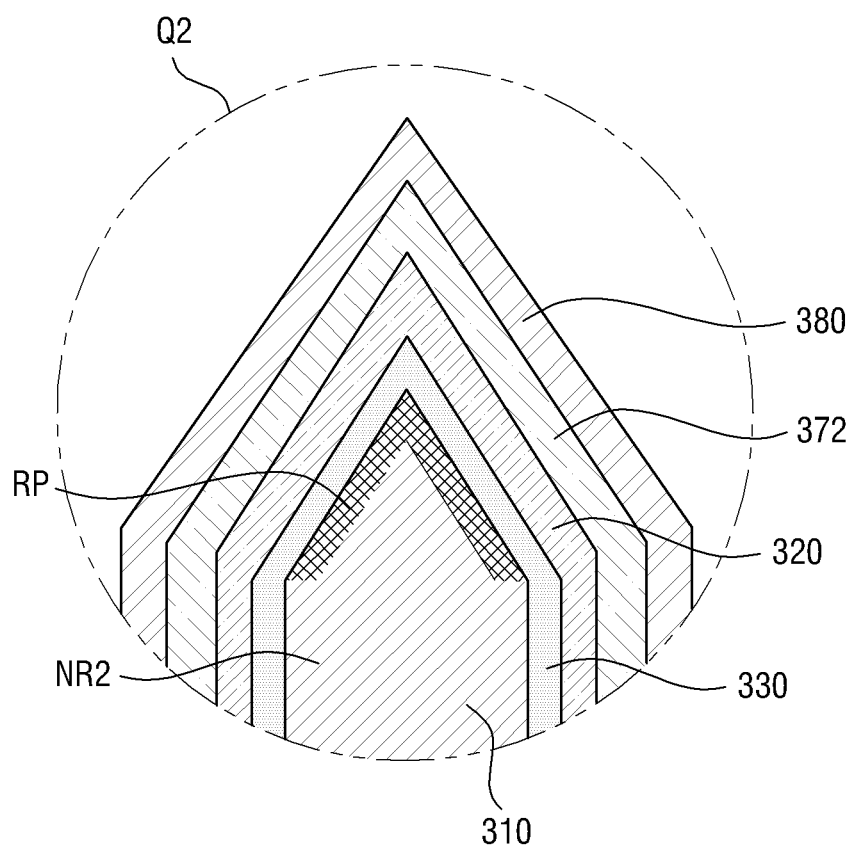
FIG. 17 is a schematic enlarged view of part Q2 of FIG. 16.

FIG. 16 is a schematic cross-sectional view of a light emitting element according to still another embodiment. FIG. 17 is a schematic enlarged view of part Q2 of FIG. 16.

Referring to FIGS. 16 and 17, in a light emitting element 300_3 according to the embodiment, a first semiconductor layer 310_3 may include a doped region RP doped with a second conductivity type dopant in at least a partial region of the second portion NR2, and an active layer 330_3 may also be disposed between the doped region RP of the first semiconductor layer 310_3 and a second semiconductor layer 320_3. The light emitting element 300_3 according to the embodiment is different from the light emitting element 300 of FIG. 1 at least in that the first semiconductor layer 310_3 includes the doped region RP and the active layer 330_3 is also disposed on the second portion NR2 of the first semiconductor layer 310_3. In the following description, repetitive descriptions thereof will be omitted while focusing on differences.

The active layer 330 may be formed on the outer surface of the first semiconductor layer 310, and the content of the semiconductor material contained in the active layer 330 may vary depending on the lattice constant of the first semiconductor layer 310. The active layer 330 formed on the outer surface of the first semiconductor layer 310 having a specific lattice constant may contain a specific content of the semiconductor material to emit light of a specific wavelength band. The first portion NR1 of the first semiconductor layer 310 that is flat in a cross-sectional view may have a same lattice constant, and the active layer 330 formed on the outer surface of the first portion NR1 may contain the same content of the semiconductor material to emit light of substantially a same wavelength band. On the other hand, the lattice constant of the second portion NR2 of the first semiconductor layer 310 may vary depending on positions due to its inclined outer surface in a cross-sectional view. In case that the active layer 330 is formed on the second portion NR2, the content of the semiconductor material may vary depending on positions, and lights of different wavelength bands may be emitted.

On the other hand, in the light emitting element 300_3 of FIGS. 16 and 17, the doped region RP may be formed in at least a partial region of the second portion NR2 of the first semiconductor layer 310_3, e.g., in the area facing the second semiconductor layer 320_3. The doped region RP may be an area doped with second conductivity type impurities different from first conductivity type impurities on the first semiconductor layer 310_3 doped with the first conductivity type impurities. For example, the doped region RP may be an area doped with the same conductivity type impurities as the second semiconductor layer 320_3.

Even if the active layer 330_3 is formed on the second portion NR2 of the first semiconductor layer 310_3, the active layer 330_3 may be disposed between the second semiconductor layer 320_3 and the doped region RP of the first semiconductor layer 310_3. The second semiconductor layer 320_3 and the doped region RP may be doped with substantially the same conductivity type impurities with the active layer 330_3 therebetween, and electrons and holes may not move between them. Accordingly, a portion of the active layer 330_3 formed on the doped region RP of the first semiconductor layer 310_3 may not generate light even if electrons and holes are combined or recombined, and only a portion of the active layer 330_3 formed on the first portion NR1 may generate light. In the light emitting element 300_3 of FIGS. 16 and 17, even if the active layer 330_3 is disposed to surround the first portion NR1 and the second portion NR2 of the first semiconductor layer 310_3, only a portion of the active layer 330_3 overlapping the first portion NR1 may generate light of a specific wavelength band.

Figure 18:
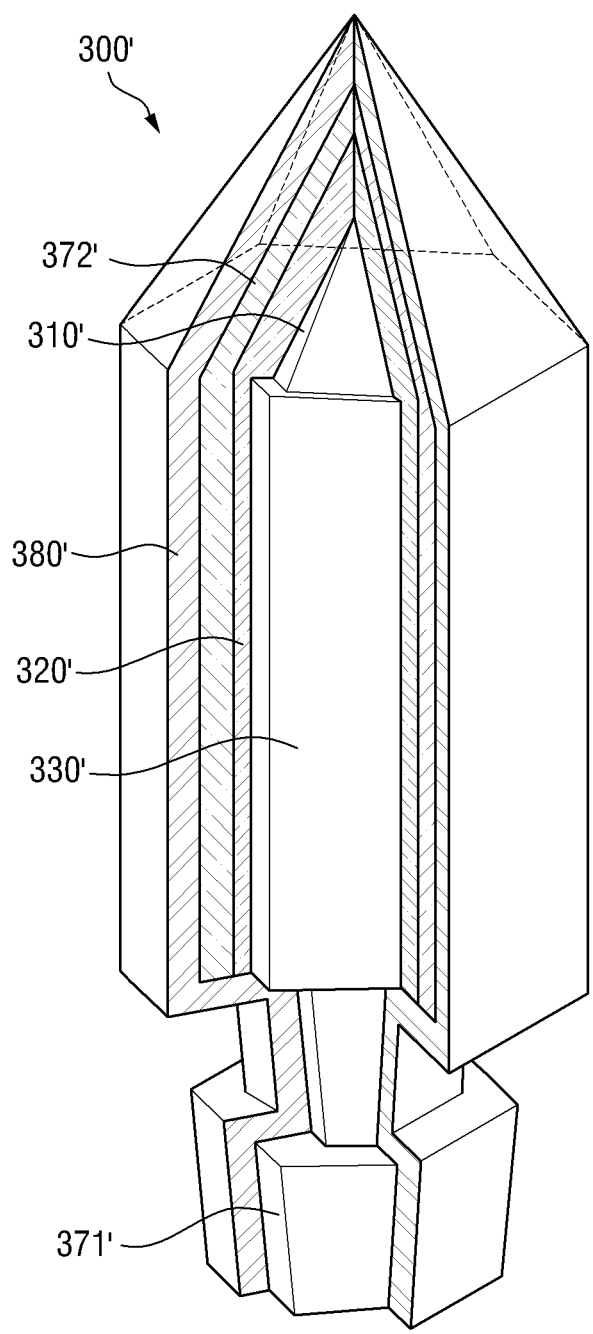
FIG. 18 is a schematic view of a light emitting element according to still another embodiment.

FIG. 18 is a schematic view of a light emitting element according to still another embodiment.

Referring to FIG. 18, in a light emitting element 300' according to the embodiment, a first portion NR1, a second portion NR2, and a third portion NR3 of a first semiconductor layer 310' may have a polygonal prism shape, e.g., a hexagonal prism shape. Accordingly, the outer surfaces of an active layer 330', a second semiconductor layer 320', a first electrode layer 371', a second electrode layer 372', and an insulating film 380' formed on the first semiconductor layer 310' may have an angled shape corresponding to the shape of the first semiconductor layer 310'. Although it is illustrated in the drawing that the light emitting element 300' has a hexagonal prism shape, the disclosure is not limited thereto. The light emitting element 300' according to the embodiment is different from the light emitting element 300 of FIG. 1 with respect to its shape. Since the other features are the same as those of the light emitting element 300 of FIG. 1, detailed description thereof will be omitted.

Unlike the light emitting element 300 of FIG. 1, the light emitting element 300 according to an embodiment may include the active layer 330 containing different materials to emit rays of light of colors other than blue.

As described above, in the light emitting element 300 of FIGS. 1 and 2, the active layer 330 may contain nitrogen (N) to emit blue or green light. On the other hand, in the light emitting element 300 according to some embodiments, each of the active layer 330 and other semiconductor layers may be a semiconductor containing at least phosphorus (P). For example, the light emitting element 300 according to an embodiment may emit red light having a central wavelength band in a range of about 620 nm to about 750 nm. However, it should be understood that the central wavelength band of red light is not limited to the above-mentioned range, and includes all wavelength ranges that can be recognized as red in the art.

In case that the light emitting element 300 emits red light, the first semiconductor layer 310 may be an n-type semiconductor layer and may include a semiconductor material having a chemical formula of $In_xAl_yGa_{1-x-y}P$ ($0 \leq x \leq 1$, $0 \leq y \leq 1$, $0 \leq x+y \leq 1$). For example, the first semiconductor layer 310 may be any one or more of InAlGaP, GaP, AlGaP, InGaP, AlP, and InP doped with an n-type dopant. The first semiconductor layer 310 may be doped with a first conductivity type dopant. For example, the first conductivity type dopant may be Si, Ge, Sn, or the like. In an embodiment, the first semiconductor layer 310 may be n-AlGaInP doped with n-type Si.

The second semiconductor layer 320 may be a p-type semiconductor layer and may include a semiconductor material having a chemical formula of $In_xAl_yGa_{1-x-y}P$ ($0 \leq x \leq 1$, $0 \leq y \leq 1$, $0 \leq x+y \leq 1$). For example, the second semiconductor layer 320 may be one or more of InAlGaP, GaP, AlGaNP, InGaP, AlP, and InP doped with a p-type dopant. The second semiconductor layer 320 may be doped with a second conductive dopant. For example, the second conductive dopant may be Mg, Zn, Ca, Se, Ba, or the like. In an embodiment, the second semiconductor layer 320 may be p-GaP doped with p-type Mg.

Similar to the active layer 330 of FIG. 1, the active layer 330 may contain a material having a single or multiple quantum well structure to emit light of a specific wavelength band. For example, in case that the active layer 330 emits light of a red wavelength band, the active layer 330 may include a material such as AlGaP, AlInGaP, or the like. In case that the active layer 330 has a multiple quantum well structure in which quantum layers and well layers are alternately stacked, the quantum layer may include a material such as AlGaP or AlInGaP, and the well layer may include a material such as GaP or AlInP. In an embodiment, the active layer 330 may include AlGaInP as a quantum layer and AlInP as a well layer to emit red light having a central wavelength band of about 620 nm to about 750 nm. In the light emitting element 300 according to an embodiment, the first semiconductor layer 310, the second semiconductor layer 320, and the active layer 330 may contain different materials to emit lights of different wavelength bands.

In some embodiments, the light emitting elements 300 emitting rays of light of different wavelength bands may have different diameters. The active layer 330 emitting rays of light of different wavelength bands may be formed on the first semiconductor layer 310 having different lattice constants. The lattice constant of the first semiconductor layer 310 may vary depending on the diameter of the first portion NR1, and the size of the light emitting element 300 may vary depending on the diameter of the first semiconductor layer 310. Detailed descriptions thereof will be given below.

According to an embodiment, the display device 10 may include the above-described light emitting element 300 to display light of a specific wavelength band. In some embodiments, the display device 10 may include the light emitting element 300 of FIG. 1 to display blue or green light, or may include the light emitting element 300' of FIG. 18 to display red light.

FIG. 19 is a schematic plan view of a display device according to an embodiment.

Referring to FIG. 19, a display device 10 displays a moving image or a still image. The display device 10 may refer to any electronic device providing a display screen. Examples of the display device 10 may include a television, a laptop computer, a monitor, a billboard, an Internet of things (IoT) device, a mobile phone, a smartphone, a tablet personal computer (PC), an electronic watch, a smartwatch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel which provides a display screen. Examples of the display panel may include an LED display panel, an organic light emitting display panel, a quantum dot light emitting display panel, a plasma display panel, and a field emission display panel. In the following description, a case where an LED display panel is applied as a display panel will be described as an example, but the disclosure is not limited thereto, and other display panels may be applied within the same scope of technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DA of the display device 10 may also be similar to the overall shape of the display device 10. In FIG. 19, the display device 10 and the display area DA having a rectangular shape elongated in the horizontal direction are illustrated.

The display device 10 may include the display area DA and a non-display area NDA. The display area DA is an area where an image can be displayed, and the non-display area NDA is an area where an image is not displayed. The display area DA may also be referred to as an active region, and the non-display area NDA may also be referred to as a non-active region.

The display area DA may substantially occupy the center of the display device 10. The display area DA may include pixels PX. The pixels PX may be arranged in a matrix. The shape of each pixel PX may be a rectangular or square shape in a plan view. However, the disclosure is not limited thereto, and it may be a rhombic shape in which each side is inclined with respect to a first direction DR1. Each of the pixels PX may include one or more light emitting elements 300 that emit light of a specific wavelength band to display a specific color.

Figure 20:
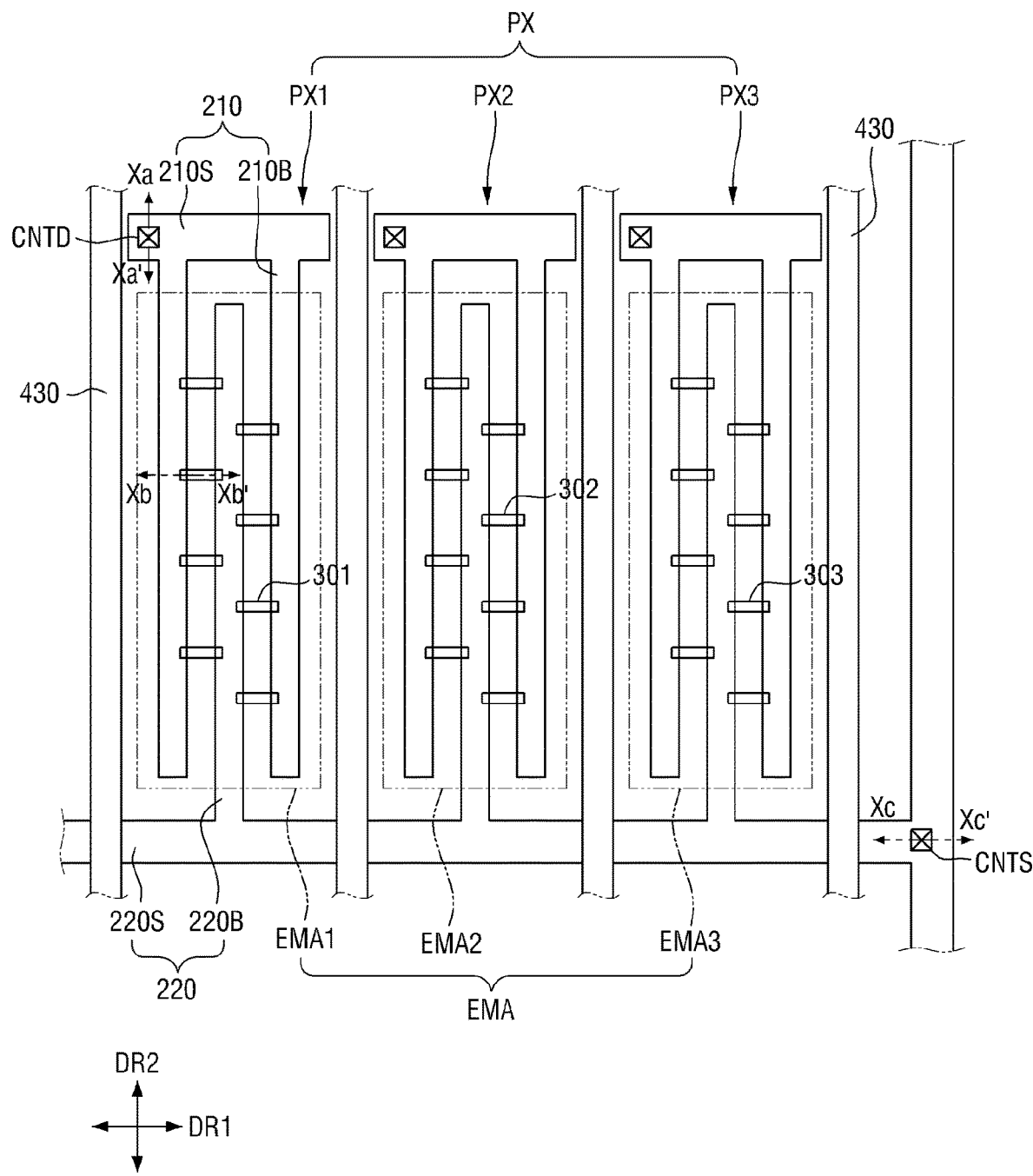
FIG. 20 is a schematic plan view of a pixel of a display device according to an embodiment.

FIG. 20 is a schematic plan view of a pixel of a display device according to an embodiment.

Referring to FIG. 20, each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red, but the disclosure is not limited thereto. All the sub-pixels PXn may emit light of a same color where n is a natural number. Although FIG. 20 illustrates that the pixel PX includes three sub-pixels PXn, the disclosure is not limited thereto, and the pixel PX may include a larger number of sub-pixels PXn.

In the disclosure, although "first," "second," and so forth are used to refer to individual components, they are used to simply distinguish the components from each other and do not necessarily mean the components. For example, the components defined as "first," "second," and so forth are not necessarily limited to particular structures or locations, and, in some embodiments, other reference numerals may be assigned thereto. Therefore, the reference numerals assigned to the individual components may be explained through the drawings and the description below, and a first component mentioned below may be a second component within the technical spirit of the disclosure.

Each sub-pixel PXn of the display device 10 may include a region defined as an emission area EMA. The first sub-pixel PX1 may include a first emission area EMA1, the second sub-pixel PX2 may include a second emission area EMA2, and the third sub-pixel PX3 may include a third emission area EMA3. The emission area EMA may be defined as a region where the light emitting elements 300 included in the display device 10 are disposed to emit light of a specific wavelength band. The light emitting element 300 includes the active layer 330, and the active layer 330 may emit light of a specific wavelength band without directionality. For example, lights emitted from the active layer 330 of the light emitting element 300 may be emitted in a lateral direction of the light emitting element 300 as well as in directions of both ends of the light emitting element 300. The emission area EMA of each sub-pixel PXn may include a region where the light emitting element 300 is disposed, for example, a region adjacent to the light emitting element 300 where rays of light emitted from the light emitting element 300 are emitted. However, the disclosure is limited thereto, and the emission area EMA may also include a region where the light emitted from the light emitting element 300 is reflected or refracted by another member and emitted. The light emitting elements 300 may be disposed in the respective sub-pixels PXn, and the emission area EMA may be formed to include an area where the light emitting element 300 is disposed and an area adjacent thereto.

Although not illustrated in the drawing, each sub-pixel PXn of the display device 10 may include a non-emission area defined as a region other than the emission area EMA. The non-emission area may be defined as a region in which the light emitting element 300 is not disposed and a region from which light is not emitted because light emitted from the light emitting element 300 does not reach the region.

Figure 22:
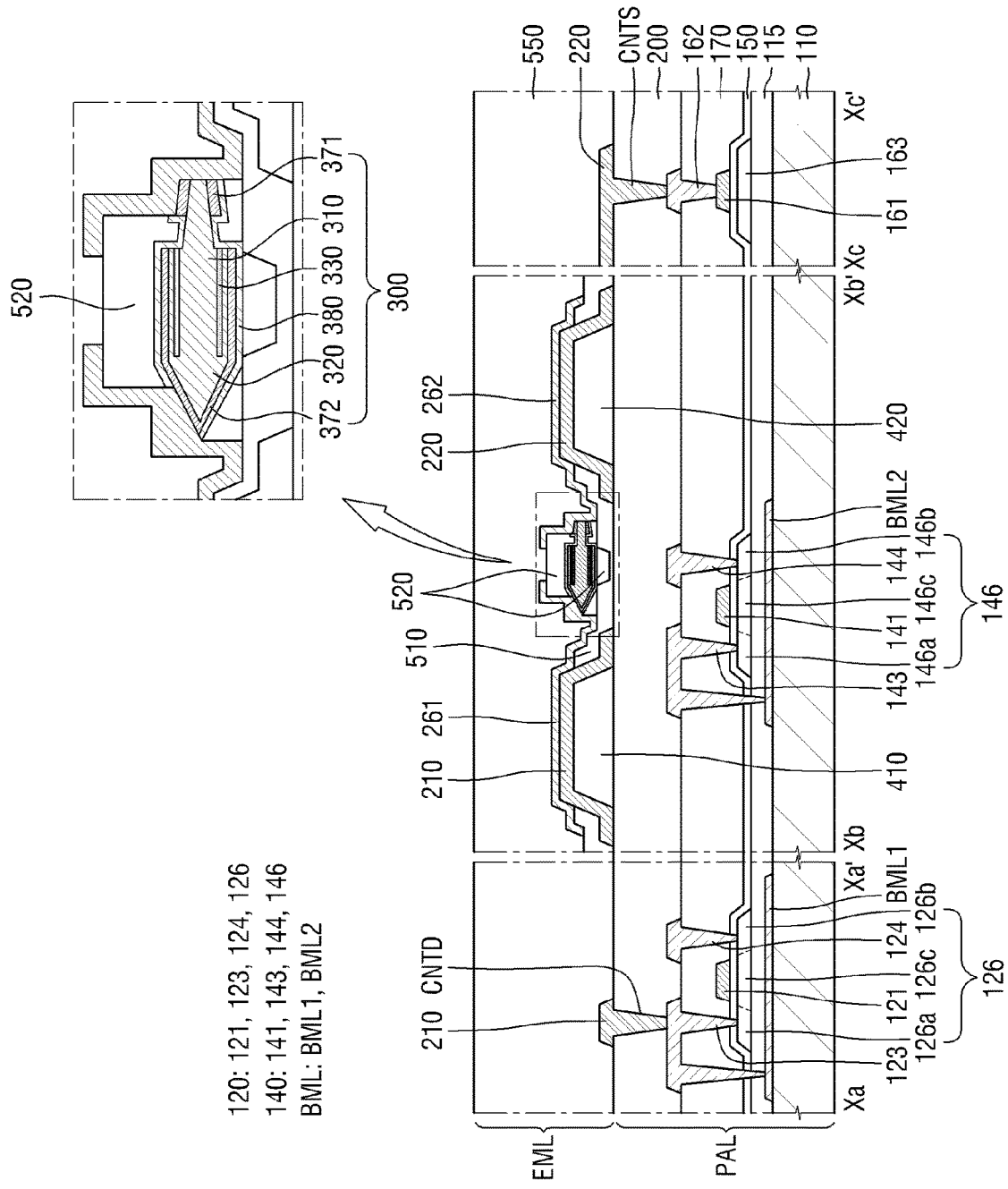
FIG. 22 is a schematic cross-sectional view taken along lines Xa-Xa', Xb-Xb' and Xc-Xc' of FIG. 20.

Each sub-pixel PXn of the display device 10 may include electrodes 210 and 220, the light emitting elements 300, multiple banks 410, 420, and 430 (see FIG. 22), and at least one insulating layer 510, 520 or 550 (see FIG. 22).

The electrodes 210 and 220 may be electrically connected with the light emitting elements 300, and may receive a preset voltage applied thereto to allow the light emitting elements 300 to emit light in a specific wavelength band. Further, at least a part of each of the electrodes 210 and 220 may be used to form an electric field within the sub-pixel PXn to align the light emitting elements 300 with each other.

The electrodes 210 and 220 may include a first electrode 210 and a second electrode 220. In an embodiment, the first electrode 210 may be a pixel electrode which is separated for each sub-pixel PXn, and the second electrode 220 may be a common electrode connected (or extended) along the respective sub-pixels PXn. One of the first and second electrodes 210 and 220 may be an anode electrode of the light emitting element 300, and the other may be a cathode electrode of the light emitting element 300. However, the disclosure is not limited thereto, and an opposite case may also be possible.

The first and second electrodes 210 and 220 may include respective electrode stems 210S and 220S arranged to extend in the first direction DR1 and at least one respective electrode branches 210B and 220B extending, in the second direction DR2 intersecting the first direction DR1, from the respective electrode stems 210S and 220S.

The first electrode 210 may include a first electrode stem 210S extending in the first direction DR1 and at least one electrode branch 210B branched off from the first electrode stem 210S and extending in the second direction DR2.

The first electrode stems 210S of a pixel PX may be arranged such that both ends of the individual first electrode stems 210S are terminated with gaps between the respective sub-pixels PXn, and each first electrode stem 210S may be arranged on substantially the same straight line as (or collinear with) the first electrode stem 210S of another sub-pixel adjacent to it in a same row (for example, in the first direction DR1). Since the first electrode stems 210S disposed in the respective sub-pixels PXn are arranged such that both ends thereof are spaced apart from each other, it may be possible to apply different electric signals to the first electrode branches 210B, so that the first electrode branches 210B may be driven individually.

The first electrode branch 210B may be branched off from at least a part of the first electrode stem 210S and extend in the second direction DR2, and may be terminated while being spaced apart from the second electrode stem 220S which is disposed to face the first electrode stem 210S.

The second electrode 220 may include a second electrode stem 220S extending in the first direction DR1 and disposed to face the first electrode stem 210S while being distanced apart from it in the second direction DR2, and a second electrode branch 220B branched off from the second electrode stem 220S and extending in the second direction DR2. A second end of the second electrode stem 220S may be connected (or extended) to the second electrode stem 220S of another sub-pixel PXn adjacent to it in the first direction DR1. For example, unlike the first electrode stem 210S, the second electrode stem 220S may extend in the first direction DR1 across the respective sub-pixels PXn. The second electrode stem 220S that is elongated across the respective sub-pixels PXn may be extended to an outer part of the display area DA where the respective pixels PX or sub-pixels PXn are placed, or to an extension portion extended from the non-display area NDA in a direction.

The second electrode branch 220B may be disposed to face the first electrode branch 210B with a gap therebetween, and may be terminated while being spaced apart from the first electrode stem 210S. The second electrode branch 220B may be connected with (or extended to) the second electrode stem 220S, and an end of the second electrode branch 220B in the extension direction may be disposed within the sub-pixel PXn while being spaced apart from the first electrode stem 210S.

In the drawing, it is illustrated that two first electrode branches 210B are disposed in each sub-pixel PXn, and a second electrode branch 220B is disposed therebetween. However, the layout of the first and second electrode branches 210B and 220B may not be limited thereto. Further, the first and second electrodes 210 and 220 may not necessarily have the shape extending in one direction, and they may have various layouts. For example, the first electrode 210 and the second electrode 220 may have a partially curved or bent shape, and one electrode may be disposed to surround the other electrode. The layout and shape of the first and second electrodes 210 and 220 may not be particularly limited as long as at least some portions thereof face each other so that a space where the light emitting elements 300 may be disposed is formed.

Further, the first electrode 210 and the second electrode 220 may be electrically connected with a circuit element layer PAL (see FIG. 22) of the display device 10 through contact holes, for example, a first electrode contact hole CNTD and a second electrode contact hole CNTS, respectively. It is illustrated in the drawing that the second electrode contact hole CNTD is formed in every first electrode stem 210S of each sub-pixel PXn, whereas only a second electrode contact hole CNTS is formed in the single second electrode stem 220S which is elongated across the respective sub-pixels PXn. However, the disclosure is not limited thereto, and in some embodiments, the second electrode contact hole CNTS may also be formed for every sub-pixel PXn, as desired.

The multiple banks 410, 420, and 430 may include external banks 430 disposed at the boundaries between the sub-pixels PXn, and the internal banks 410 and 420 disposed under the electrodes 210 and 220 to be adjacent to the center of each sub-pixel PXn. Although the plurality of internal banks 410 and 420 are not illustrated in the drawing, the first internal bank 410 and the second internal bank 420 may be disposed under the first electrode branch 210B and the second electrode branch 220B, respectively. Descriptions thereof will be given below with reference to other drawings.

The external banks 430 may be disposed at the boundaries between the sub-pixels PXn. The first electrode stems 210S may be terminated such that their respective ends are spaced apart from each other with the external banks 430 therebetween. Each external bank 430 may extend in the second direction DR2 to be disposed at the boundary between the adjacent sub-pixels PXn which are arranged in the first direction DR1. However, the disclosure is not limited thereto, and the external bank 430 may extend in the first direction DR1 to be disposed at the boundary between the adjacent sub-pixels PXn which are arranged in the second direction DR2. The external banks 430 and the first and second internal banks 410 and 420 may include a same material and may be formed by one process.

The light emitting elements 300 may be disposed between the first electrode 210 and the second electrode 220. As shown in the drawing, the light emitting elements 300 may be disposed between the first electrode branch 210B and the second electrode branch 220B. First ends of at least some of the light emitting elements 300 may be electrically connected to the first electrode 210, and second ends thereof may be electrically connected to the second electrode 220. Each light emitting element 300 may be disposed such that both ends thereof are located on the first electrode branch 210B and the second electrode branch 220B, respectively, but the disclosure is not limited thereto. In some embodiments, the light emitting element 300 may be disposed between the first electrode 210 and the second electrode 220 so that both ends thereof do not overlap the first and second electrodes 210 and 220.

The light emitting elements 300 may be arranged substantially in parallel with each other between the electrodes 210 and 220, while being distanced apart from each other. The interval between the light emitting elements 300 is not particularly limited. In some embodiments, multiple light emitting elements 300 may be disposed adjacent to each other to form a group, and other multiple light emitting elements 300 may be arranged while being spaced apart from each other at a regular distance to form another group. For example, the light emitting elements 300 may be arranged in different densities but they may be still aligned in a direction. Further, in an embodiment, the light emitting element 300 may have a shape extending in one direction, and the extension direction of the electrodes, for example, the first electrode branch 210B and the second electrode branch 220B, may be substantially perpendicular to the extension direction of the light emitting element 300. However, the disclosure is not limited thereto, and the light emitting element 300 may be disposed diagonally with respect to the extension direction of the first electrode branch 210B and the second electrode branch 220B, not perpendicularly thereto.

The light emitting elements 300 according to an embodiment may have the active layers 330 including different materials, and thus may emit rays of light of different wavelength bands to the outside. The display device 10 according to an embodiment may include the light emitting elements 300 that emit light of different wavelength bands.

Figure 21:
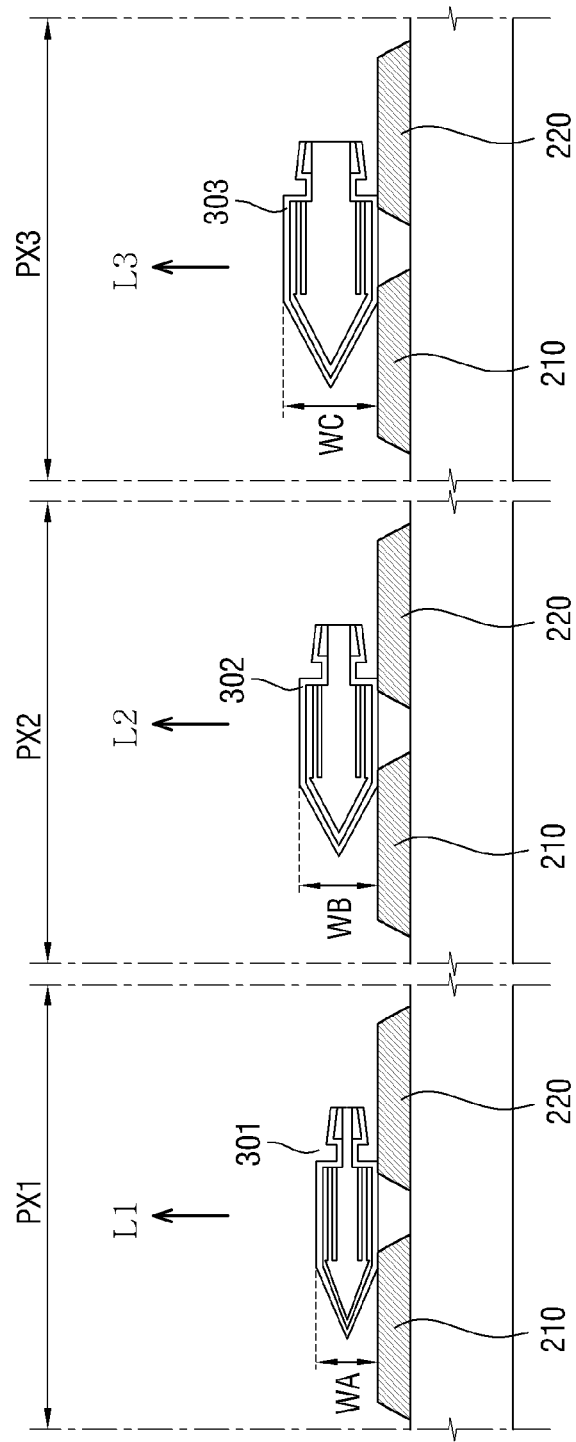
FIG. 21 is a schematic cross-sectional view of a display device according to an embodiment.

FIG. 21 is a schematic cross-sectional view of a display device according to an embodiment.

Referring to FIG. 21, the display device 10 may include a first light emitting element 301 disposed in the first sub-pixel PX1, a second light emitting element 302 disposed in the second sub-pixel PX2, and a third light emitting element 303 disposed in the third sub-pixel PX3.

The first light emitting element 301, the second light emitting element 302, and the third light emitting element 303 and the light emitting element 300 of FIG. 1 may have a same structure but may have different diameters. In an embodiment, a diameter WA of the first light emitting element 301 may be smaller than a diameter WB of the second light emitting element 302 and a diameter WC of the third light emitting element 303, and the diameter WB of the second light emitting element 302 may be smaller than the diameter WC of the third light emitting element 303. For example, the diameters WA, WB, and WC of the first light emitting element 301, the second light emitting element 302, and the third light emitting element 303 may increase in that order.

The first light emitting element 301 may include the active layer 330 emitting first light L1 having a first wavelength as a central wavelength band, the second light emitting element 302 may include the active layer 330 emitting second light L2 having a second wavelength as a central wavelength band, and the third light emitting element 303 may include the active layer 330 emitting third light L3 having a third wavelength as a central wavelength band. The light emitting element 300 according to an embodiment may emit rays of light of different colors depending on the material contained in the active layer 330 disposed in the first portion NR1 of the first semiconductor layer 310. In order to form the active layer 330 containing different materials on the first semiconductor layer 310, it is required for the first portion NR1 of the first semiconductor layer 310 to have different lattice constants. The active layer 330 containing a specific material may be formed on the first semiconductor layer 310 having a specific lattice constant, and the first semiconductor layer 310 may have different lattice constants depending on the diameter of the first portion NR1. In some embodiments, the first light emitting element 301 including the active layer 330 emitting the first light L1 may have a width smaller than that of the second light emitting element 302 including the active layer 330 emitting the second light L2 or the third light emitting element 303 including the active layer 330 emitting the third light L3. Further, the diameter WB of the second light emitting element 302 may be smaller than the diameter WC of the third light emitting element 303.

Accordingly, the first light L1 may be emitted from the first sub-pixel PX1, the second light L2 may be emitted from the second sub-pixel PX2, and the third light L3 may be emitted from the third sub-pixel PX3. In some embodiments, the display device 10 may include light emitting elements including the active layers 330 that emit rays of light of different colors, for example, the first light emitting element 301, the second light emitting element 302, and the third light emitting element 303. The first light emitting element 301, the second light emitting element 302, and the third light emitting element 303 may include the active layers 330 that emit the first light L1, the second light L2, and the third light L3, respectively.

In some embodiments, the first light L1 may be blue light having a central wavelength band of about 450 nm to about 495 nm, the second light L2 may be green light having a central wavelength band of about 495 nm to about 570 nm, and the third light L3 may be red light having a central wavelength band of about 620 nm to about 752 nm. However, the disclosure is not limited thereto. The first light L1, the second light L2, and the third light L3 may be of different colors, or may be of a same color but their central wavelength bands may differ from the above-specified ranges.

Furthermore, although not illustrated in the drawing, the display device 10 may include a first insulating layer 510 that covers (or overlaps) at least a part of the first electrode 210 and a part of the second electrode 220.

The first insulating layer 510 may be disposed in each sub-pixel PXn of the display device 10. The first insulating layer 510 may be disposed to substantially entirely cover each sub-pixel PXn, and may be extended to other neighboring sub-pixels PXn. The first insulating layer 510 may be disposed to cover at least a part of the first electrode 210 and a part of the second electrode 220. Although not illustrated in FIG. 21, the first insulating layer 510 may be disposed to expose some areas of the first and second electrodes 210 and 220, specifically, some areas of the first and second branches 210B and 220B.

The display device 10 may include, in addition to the first insulating layer 510, the circuit element layer PAL disposed under the electrodes 210 and 220, a second insulating layer 520 (see FIG. 22) disposed to cover at least some parts of the electrodes 210 and 220 and the light emitting element 300, and a passivation layer 550 (see FIG. 22). The structure of the display device 10 will hereinafter be elaborated with reference to FIG. 22.

FIG. 22 is a schematic cross-sectional view taken along lines Xa-Xa', Xb-Xb', and Xc-Xc' of FIG. 20.

FIG. 22 only illustrates a cross section of the first sub-pixel PX1, but may be applied to other pixels PX or sub-pixels PXn. FIG. 22 illustrates a cross section across first and second ends of a light emitting element 300.

Referring to FIGS. 20 and 22, the display device 10 may include the circuit element layer PAL and an emission layer EML. The circuit element layer PAL may include a substrate 110, a buffer layer 115, a light blocking layer BML, first and second transistors 120 and 140, and so forth. The emission layer EML may include the electrodes 210 and 220, the light emitting element 300, the insulating layers 510, 520, and 550, and so forth which are disposed on the first and second transistors 120 and 140.

The substrate 110 may be an insulating substrate. The substrate 110 may be made of an insulating material such as glass, quartz, or polymer resin. Further, the substrate 110 may be a rigid substrate and may also be a flexible substrate which can be bent, folded, or rolled.

The light blocking layer BML may be disposed on the substrate 110. The light blocking layer BML may include a first light blocking layer BML1 and a second light blocking layer BML2. The first light blocking layer BML1 may be electrically connected with a first drain electrode 123 of the first transistor 120 to be described below. The second light blocking layer BML2 may be electrically connected with a second drain electrode 143 of the second transistor 140.

The first light blocking layer BML1 and the second light blocking layer BML2 are arranged to overlap a first active material layer 126 of the first transistor 120 and a second active material layer 146 of the second transistor 140, respectively. The first and second light blocking layers BML1 and BML2 may include a material that blocks light, and thus can prevent light from reaching the first and second active material layers 126 and 146. For example, the first and second light blocking layers BML1 and BML2 may be formed of an opaque metal material that blocks light transmission. However, the disclosure is not limited thereto, and in some embodiments, the light blocking layer BML may be omitted.

The buffer layer 115 is disposed on the light blocking layer BML and the substrate 110. The buffer layer 115 may include the light blocking layer BML and be disposed to cover (or overlap) the entire surface of the substrate 110. The buffer layer 115 can prevent diffusion of impurity ions, prevent penetration of moisture or external air, and perform a surface planarization function. Furthermore, the buffer layer 115 may serve to insulate the light blocking layer BML and the first and second active material layers 126 and 146 from each other.

A semiconductor layer is disposed on the buffer layer 115. The semiconductor layer may include the first active material layer 126 of the first transistor 120, the second active material layer 146 of the second transistor 140, and an auxiliary layer 163. The semiconductor layer may include polycrystalline silicon, monocrystalline silicon, oxide semiconductor, and the like.

The first active material layer 126 may include a first doped region 126a, a second doped region 126b, and a first channel region 126c. The first channel region 126c may be disposed between the first doped region 126a and the second doped region 126b. The second active material layer 146 may include a third doped region 146a, a fourth doped region 146b, and a second channel region 146c. The second channel region 146c may be disposed between the third doped region 146a and the fourth doped region 146b. The first active material layer 126 and the second active material layer 146 may include polycrystalline silicon. The polycrystalline silicon may be formed by crystallizing amorphous silicon. Examples of the crystallizing method may include rapid thermal annealing (RTA), solid phase crystallization (SPC), excimer laser annealing (ELA), metal-induced lateral crystallization (MILC), and sequential lateral solidification (SLS), but the disclosure is not limited thereto. As another example, the first active material layer 126 and the second active material layer 146 may include monocrystal silicon, low-temperature polycrystalline silicon, amorphous silicon, or the like. The first doped region 126a, the second doped region 126b, the third doped region 146a, and the fourth doped region 146b may be some areas of the first active material layer 126 and the second active material layer 146 doped with impurities. However, the disclosure is not limited thereto.

A first gate insulating film 150 is disposed on the semiconductor layer. The first gate insulating film 150 may be disposed to cover (or overlap) the entire surface of the buffer layer 115 together with the semiconductor layer. The first gate insulating film 150 may function as a gate insulating film for the first and second transistors 120 and 140.

A first conductive layer is disposed on the first gate insulating film 150. The first conductive layer may be disposed on the first gate insulating film 150 and include a first gate electrode 121 disposed on the first active material layer 126 of the first transistor 120, a second gate electrode 141 disposed on the second active material layer 146 of the second transistor 140, and a power wire 161 disposed on the auxiliary layer 163. The first gate electrode 121 may overlap the first channel region 126c of the first active material layer 126, and the second gate electrode 141 may overlap the second channel region 146c of the second active material layer 146.

An interlayer insulating film 170 is disposed on the first conductive layer. The interlayer insulating film 170 may serve as an insulating film between the layers. The interlayer insulating film 170 may contain an organic insulating material and may also perform a surface planarization function.

A second conductive layer is disposed on the interlayer insulating film 170. The second conductive layer includes the first drain electrode 123 and a first source electrode 124 of the first transistor 120, the second drain electrode 143 and a second source electrode 144 of the second transistor 140, and a power electrode 162 disposed on the power wire 161.

The first drain electrode 123 and the first source electrode 124 may contact the first doped region 126a and the second doped region 126b of the first active material layer 126, respectively, via contact holes formed through the interlayer insulation film 170 and the first gate insulating film 150. The second drain electrode 143 and the second source electrode 144 may contact the third doped region 146a and the fourth doped region 146b of the second active material layer 146, respectively, via contact holes formed through the interlayer insulation film 170 and the first gate insulating film 150. Further, the first drain electrode 123 and the second drain electrode 143 may be electrically connected with the first light blocking layer BML1 and the second light blocking layer BML2, respectively, via other contact holes.

A via layer 200 is disposed on the second conductive layer. The via layer 200 contains an organic insulating material and may perform a surface planarization function.

The multiple banks 410, 420, and 430, the electrodes 210 and 220, and the light emitting element 300 may be disposed on the via layer 200.

The multiple banks 410, 420, and 430 may include the internal banks 410 and 420 arranged within each sub-pixel PXn while being spaced apart from each other, and the external banks 430 disposed at the boundaries between the neighboring sub-pixels PXn.

The external banks 430 may function to prevent ink from going over the boundaries of the sub-pixels PXn when jetting (or spraying) the ink in which the light emitting elements 300 are dispersed using an inkjet printing device in the manufacture of the display device 10. However, the disclosure is not limited thereto.

The multiple internal banks 410 and 420 may include the first internal bank 410 and the second internal bank 420 disposed adjacent to the center of each sub-pixel PXn.

The first internal bank 410 and the second internal bank 420 are disposed to face each other while being spaced apart from each other. The first electrode 210 may be disposed on the first internal bank 410, and the second electrode 220 may be disposed on the second internal bank 420. Referring to FIGS. 20 and 22, it can be understood that the first electrode branch 210B is disposed on the first internal bank 410, and the second electrode branch 220B is disposed on the second internal bank 420.

The first internal bank 410 and the second internal bank 420 may extend in the second direction DR2 within each sub-pixel PXn. Although not illustrated in the drawing, the first internal bank 410 and the second internal bank 420 may extend in the second direction DR2 toward the sub-pixels PXn adjacent in the second direction DR2. However, the disclosure is not limited thereto, and the first internal bank 410 and the second internal bank 420 may be disposed in each of the sub-pixels PXn separately, forming a pattern on the entire surface of the display device 10. The multiple banks 410, 420, and 430 may include polyimide (PI), but the disclosure is not limited thereto.

Each of the first internal bank 410 and the second internal bank 420 may have a structure with at least a part thereof protruding above the via layer 200. Each of the first internal bank 410 and the second internal bank 420 may protrude above the plane on which the light emitting element 300 is disposed, and at least a part of this protruding portion may have a slope. The shape of the protruding portions of the first and second internal banks 410 and 420 is not particularly limited.

The electrodes 210 and 220 may be disposed on the via layer 200 and the internal banks 410 and 420, respectively. As stated above, the electrodes 210 and 220 include the electrode stems 210S and 220S and the electrode branches 210B and 220B, respectively. Line Xa-Xa' of FIG. 20 is a line that crosses the first electrode stem 210S, line Xb-Xb' of FIG. 20 is a line that crosses the first and second electrode branches 210B and 220B, and line Xc-Xc' of FIG. 20 is a line that crosses the second electrode stem 220S. For example, the first electrode 210 disposed in the area corresponding to line Xa-Xa' of FIG. 22 can be understood to be the first electrode stem 210S, the first electrode 210 and the second electrode 220 disposed in the area corresponding to line Xb-Xb' of FIG. 22 can be understood to be the first electrode branch 210B and the second electrode branch 220B, respectively, and the second electrode 220 disposed in the area corresponding to line Xc-Xc' of FIG. 22 can be understood to be the second electrode stem 220S. The electrode stems 210S and the electrode branch 210B may constitute the first electrode 210, and the electrode stem 220S and the electrode branch 220B may constitute the second electrode 220.

Some areas of the first and second electrodes 210 and 220 may be disposed on the via layer 200, and some other areas thereof may be disposed on the first and second internal banks 410 and 420, respectively. As stated above, the first electrode stem 210S of the first electrode 210 and the second electrode stem 220S of the second electrode 220 may extend in the first direction DR1, and the first internal bank 410 and the second internal bank 420 may extend in the second direction DR2 to be disposed in the neighboring sub-pixels PXn in the second direction DR2. Although not illustrated in the drawings, the first electrode stem 210S of the first electrode 210 and the second electrode stem 220S of the second electrode 220 which extend in the first direction DR1 may partially overlap the first internal bank 410 and the second internal bank 420, respectively. However, the disclosure is not limited thereto, and the first electrode stem 210S and the second electrode stem 220S may not overlap the first internal bank 410 and the second internal bank 420, respectively.

The first electrode stem 210S of the first electrode 210 may be provided with the first electrode contact hole CNTD formed through the via layer 200 to expose a part of the first drain electrode 123 of the first transistor 120. The first electrode 210 may contact the first drain electrode 123 through the first electrode contact hole CNTD. The first electrode 210 may be electrically connected with the first drain electrode 123 of the first transistor 120 to receive an electrical signal therefrom.

The second electrode stem 220S of the second electrode 220 may extend in a direction to be disposed in a non-emission area as well where a light emitting element 300 is not disposed. The second electrode stem 220S may be provided with the second electrode contact hole CNTS formed through the via layer 200 to expose a part of the power electrode 162. The second electrode 220 may contact the power electrode 162 through the second electrode contact hole CNTS. The second electrode 220 may be electrically connected with the power electrode 162 to receive an electrical signal from the power electrode 162.

Some areas of the first electrode 210 and the second electrode 220, for example, the first electrode branch 210B and the second electrode branch 220B may be disposed on the first internal bank 410 and the second internal bank 420, respectively. The first electrode branch 210B of the first electrode 210 may be disposed to cover the first internal bank 410, and the second electrode branch 220B of the second electrode 220 may be disposed to cover the second internal bank 420. Since the first internal bank 410 and the second internal bank 420 are disposed at the center of each sub-pixel PXn while being spaced apart from each other, the first electrode branch 210B and the second electrode branch 220B may also be spaced apart from each other. The multiple light emitting elements 300 may be disposed in a region between the first electrode 210 and the second electrode 220, for example, in the space where the first electrode branch 210B and the second electrode branch 220B are disposed to face each other with a gap therebetween.

Each of the electrodes 210 and 220 may include a transparent conductive material. For example, each of the electrodes 210 and 220 may include a material such as indium tin oxide (ITO), indium zinc oxide (IZO), and indium tin zinc oxide (ITZO), but the disclosure is not limited thereto. In some embodiments, each of the electrodes 210 and 220 may include a conductive material having high reflectivity. For example, each of the electrodes 210 and 220 may include, as a material having high reflectivity, metal such as silver (Ag), copper (Cu), or aluminum (Al). In this case, light incident on each of the electrodes 210 and 220 may be reflected to be emitted in an upward direction of each sub-pixel PXn.

Further, each of the electrodes 210 and 220 may have a structure in which at least one transparent conductive material and at least one metal layer having high reflectivity are stacked, or may be formed as a layer including them. In an embodiment, each of the electrodes 210 and 220 may have a stacked structure of ITO/silver(Ag)/ITO/IZO, or may be made of an alloy including aluminum (Al), nickel (Ni), and lanthanum (La). However, the disclosure is not limited thereto.

The first insulating layer 510 is disposed on the via layer 200, the first electrode 210, and the second electrode 220. The first insulating layer 510 is disposed to partially cover the first electrode 210 and the second electrode 220. The first insulating layer 510 may be disposed to cover most of the top surfaces of the first and second electrodes 210 and 220 while exposing a part of the first and second electrodes 210 and 220. The first insulating layer 510 may be disposed such that some of the top surfaces of the first and second electrodes 210 and 220, for example, a part of the top surface of the first electrode branch 210B disposed on the first internal bank 410 and a part of the top surface of the second electrode branch 220B disposed on the second internal bank 420 are exposed. For example, the first insulating layer 510 may be formed on the substantially entire surface of the via layer 200, but it may have openings through which the first electrode 210 and the second electrode 220 are partially exposed. The openings of the first insulating layer 510 may be positioned to expose the relatively flat top surfaces of the first electrode 210 and the second electrode 220.

In an embodiment, the first insulating layer 510 may be formed to have a step such that a portion of the top surface thereof is recessed between the first electrode 210 and the second electrode 220. In some embodiments, the first insulating layer 510 may include an inorganic insulating material, and a portion of the top surface of the first insulating layer 510 disposed to cover the first electrode 210 and the second electrode 220 may be recessed due to a step of the member disposed therebelow. The light emitting element 300 disposed on the first insulating layer 510 between the first electrode 210 and the second electrode 220 may form an empty space with the recessed top surface of the first insulating layer 510. The light emitting element 300 may be disposed partially spaced apart from the top surface of the first insulating layer 510 with a clearance therebetween, and this clearance may be filled with a material forming the second insulating layer 520 to be described below.

However, the disclosure is not limited thereto. The first insulating layer 510 may be formed to have a flat top surface so that the light emitting element 300 is disposed thereon. The top surface may extend in a direction toward the first electrode 210 and the second electrode 220, and may be terminated at inclined side surfaces of the first electrode 210 and the second electrode 220. For example, the first insulating layer 510 may be disposed in an area where the electrodes 210 and 220 overlap the inclined side surfaces of the first internal bank 410 and the second internal bank 420, respectively. Contact electrodes 261 and 262 to be described below may contact the exposed areas of the first and second electrodes 210 and 220 and may smoothly contact an end of the light emitting element 300 on the flat top surface of the first insulating layer 510.

The first insulating layer 510 may protect the first electrode 210 and the second electrode 220 while insulating them from each other. Further, it is possible to prevent the light emitting element 300 disposed on the first insulating layer 510 from being damaged by direct contact with other members. However, the shape and structure of the first insulating layer 510 are not limited thereto.

The light emitting element 300 may be disposed on the first insulating layer 510 between the electrodes 210 and 220. For example, at least one light emitting element 300 may be disposed on the first insulating layer 510 disposed between the electrode branches 210B and 220B. However, the disclosure is not limited thereto, and at least some of the light emitting elements 300 disposed in each sub-pixel PXn may be placed in a region other than the region between the electrode branches 210B and 220B. Further, the light emitting element 300 may be disposed such that some areas thereof overlap the electrodes 210 and 220. The light emitting element 300 may be disposed on facing ends of the first electrode branch 210B and the second electrode branch 220B, and may be electrically connected to the electrodes 210 and 220 via the contact electrodes 261 and 262.

As stated above, the light emitting elements 300 configured to emit rays of light L1, L2, and L3 having different wavelengths may be disposed in each of the sub-pixels PXn. Although the drawing only illustrates the first sub-pixel PX1 in which the first light emitting element 301 is disposed, the above-described structures and features may also be applicable to the second sub-pixel PX2 and the third sub-pixel PX3.

Further, the light emitting element 300 may include multiple layers arranged in a direction horizontal to the via layer 200. The light emitting element 300 of the display device 10 according to an embodiment may be disposed such that the extension direction of the main body part 300A is parallel to the via layer 200. In the light emitting element 300, the insulating film 380, the second electrode layer 372 or the first electrode layer 371, the second semiconductor layer 320, the active layer 330, and the first semiconductor layer 310 may be sequentially disposed on the first insulating layer 510 in a direction perpendicular to the via layer 200 in a cross-sectional view. Further, since the layers of the light emitting element 300 are formed to surround the outer surfaces of other layers, the light emitting element 300 disposed in the display device 10 may have a symmetrical structure with respect to the first portion NR1 of the first semiconductor layer 310 in a cross-sectional view. For example, the light emitting element 300 may have a shape in which the active layer 330, the second semiconductor layer 320, the second electrode layer 372 or the first electrode layer 371, and the insulating film 380 are sequentially staked from the first semiconductor layer 310 in a direction perpendicular to the via layer 200. However, the disclosure is not limited thereto. The order in which the multiple layers of the light emitting element 300 are arranged may be reverse to the order mentioned above. In some embodiments, if the light emitting element 300 has a different structure, the multiple layers may be arranged in a direction horizontal to the via layer 200.

In the display device 10 according to an embodiment, at least a partial region of the insulating film 380 of the light emitting element 300 may be removed to partially expose the first electrode layer 371 and the second electrode layer 372. During the manufacturing process of the display device 10, in the step of forming the second insulating layer 520 covering the outer surface of the light emitting element 300, the insulating film 380 may be partially removed. The exposed first electrode layer 371 may contact a second contact electrode 262 to be described below, and the exposed second electrode layer 372 may contact a first contact electrode 261. As described above, since the first electrode layer 371 and the second electrode layer 372 of the light emitting element 300 are spaced apart from each other without being electrically connected to each other, even if the first contact electrode 261 and the second contact electrode 262 contact the second electrode layer 372 and the first electrode layer 371, respectively, they may not be electrically connected to each other.

Further, the light emitting element 300 may include the first end 300B having an inclined side surface and the second end 300C extending with a width smaller than that of the main body part 300A with the main body part 300A therebetween. In the light emitting element 300 disposed on the first insulating layer 510, the side surface of the main body part 300A may partially contact the first insulating layer 510, and the first end 300B and the second end 300C may be spaced apart from the first insulating layer 510. The second insulating layer 520 may be further disposed in the region where the main body part 300A, the first end 300B, and the second end 300C of the light emitting element 300 are spaced apart from the first insulating layer 510.

The second insulating layer 520 may be partially disposed on the light emitting element 300. The second insulating layer 520 may be disposed to partially surround the outer surface of the light emitting element 300. The second insulating layer 520 may protect the light emitting element 300 while fixing the light emitting element 300 in the manufacturing process for the display device 10. Further, in an embodiment, some of the material of the second insulating layer 520 may be disposed between a bottom surface of the light emitting element 300 and the first insulating layer 510. As described above, the second insulating layer 520 may be formed to fill the clearance between the light emitting element 300 and the first insulating film 510 formed in the manufacturing process of the display device 10. Accordingly, the second insulating film 520 may be formed to surround the outer surface of the light emitting element 300. However, the disclosure is not limited thereto.

The second insulating layer 520 may extend in the second direction DR2 between the first electrode branch 210B and the second electrode branch 220B in a plan view. As an example, the second insulating layer 520 may have an island or linear shape on the via layer 200 in a plan view.

The contact electrodes 261 and 262 are disposed on the electrodes 210 and 220 and the second insulating layer 520. The first contact electrode 261 and the second contact electrode 262 may be disposed on the second insulating layer 520 to be spaced from each other. The second insulating layer 520 may insulate the first contact electrode 261 and the second contact electrode 262 from each other lest they should directly contact each other.

Although not illustrated in the drawing, the multiple contact electrodes 261 and 262 may extend in the second direction DR2 in a plan view and spaced apart from each other in the first direction DR1. The contact electrodes 261 and 262 may contact at least one end of the light emitting element 300, and the contact electrodes 261 and 262 may be electrically connected with the first electrode 210 or the second electrode 220 to receive electrical signals. The contact electrodes 261 and 262 may include the first contact electrode 261 and the second contact electrode 262. The first contact electrode 261 may be disposed on the first electrode branch 210B to contact one end (or first end) of the light emitting element 300, and the second contact electrode 262 may be disposed on the second electrode branch 220B to contact the other end (or second end) of the light emitting element 300.

The first contact electrode 261 may contact the exposed area of the first electrode 210 on the first internal bank 410, and the second contact electrode 262 may contact the exposed area of the second electrode 220 on the second internal bank 420. The contact electrodes 261 and 262 may be capable of transferring the electrical signals transmitted from the electrodes 210 and 220 to the light emitting element 300, respectively.

The contact electrodes 261 and 262 may include a conductive material. For example, they may include ITO, IZO, ITZO, aluminum (Al), or the like. However, the disclosure is not limited thereto.

The passivation layer 550 may be disposed on the first contact electrode 261, the second contact electrode 262, and the second insulating layer 520. The passivation layer 550 may function to protect the members disposed on the via layer 200 from the external environment.

Each of the first insulating layer 510, the second insulating layer 520, and the passivation layer 550 described above may include an inorganic insulating material or an organic insulating material. In an embodiment, the first insulating layer 510, the second insulating layer 520 and the passivation layer 550 may include an inorganic insulating material such as silicon oxide ($SiO_x$), silicon nitride ($SiN_x$), silicon oxynitride ($SiO_xN_y$), aluminum oxide ($Al_2O_3$), aluminum nitride (AlN), and the like. The first insulating layer 510, the second insulating layer 520, and the passivation layer 550 may include an organic insulating material such as acrylic resin, epoxy resin, phenolic resin, polyamide resin, polyimide resin, unsaturated polyester resin, polyphenylene resin, polyphenylene-sulfide resin, benzocyclobuten, cardo resin, siloxane resin, silsesquioxane resin, polymethylmetacrylate, polycarbonate, or polymethylmetacrylate-polycarbonate synthetic resin. However, the disclosure is not limited thereto.

The display device 10 may further include a larger number of insulating layers. According to an embodiment, the display device 10 may further include a third insulating layer (see, e.g., 530_1 in FIG. 23) disposed to protect the first contact electrode 261.

Figure 23:
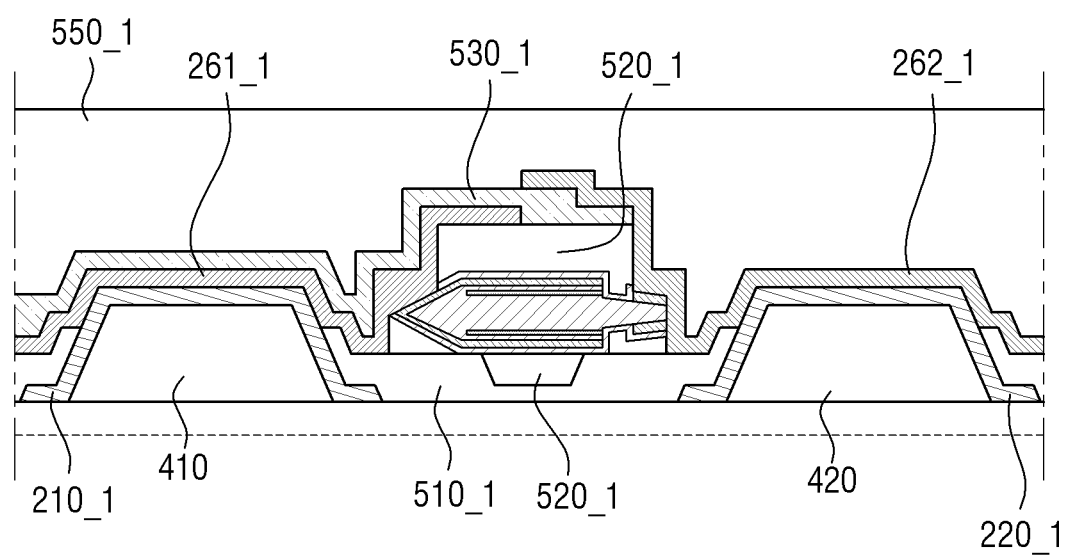
FIG. 23 is a schematic cross-sectional view of a display device according to another embodiment.

FIG. 23 is a schematic cross-sectional view of a display device according to another embodiment.

Referring to FIG. 23, a display device 10_1 according to the embodiment may further include a third insulating layer 530_1 disposed on a first contact electrode 262_1. The display device 10_1 of the embodiment is different from the display device 10 of FIG. 20 at least in that it further includes the third insulating layer 530_1 and at least a part of a second contact electrode 262_1 is disposed on the third insulating layer 530_1. In the following description, repetitive descriptions thereof will be omitted while focusing on differences.

The display device 10_1 of FIG. 23 may be disposed on the first contact electrode 261_1 and may include the third insulating layer 530_1 serving to insulate the first contact electrode 261_1 and the second contact electrode 262_1 from each other electrically. The third insulating layer 530_1 may be disposed to cover the first contact electrode 261_1, but may be disposed so as not to overlap some areas of the light emitting element 300 so that the light emitting element 300 can be electrically connected to the second contact electrode 262_1. The third insulating layer 530_1 may partially contact the first contact electrode 261_1 and a second insulating layer 520_1 on a top surface of the second insulating layer 520_1. The third insulating layer 530_1 may be disposed to cover (or overlap) an end of the first contact electrode 261_1 on the second insulating layer 520_1. Accordingly, the third insulating layer 530_1 may protect the first contact electrode 261_1 while functioning to electrically insulate the first contact electrode 261_1 from the second contact electrode 262_1.

The lateral surface of the third insulating layer 530_1 on a side where the second contact electrode 262_1 is located may be aligned with a lateral surface of the second insulating layer 520_1. However, the disclosure is not limited thereto. In some embodiments, similar to the first insulating layer 510, the third insulating layer 530_1 may include an inorganic insulating material.

The first contact electrode 261_1 may be disposed between a first electrode 210_1 and the third insulating layer 530_1, and the second contact electrode 262_1 may be disposed on the third insulating layer 530_1. The second contact electrode 262_1 may partially contact a first insulating layer 510_1, the second insulating layer 520_1, the third insulating layer 530_1, a second electrode 220_1, and the light emitting element 300. An end of the second contact electrode 262_1 on a side where the first electrode 210_1 is located may be disposed on the third insulating layer 530_1.

A passivation layer 550_1 may be disposed on the third insulating layer 530_1 and the second contact electrode 262_1 to protect them. Hereinafter, repetitive descriptions thereof will be omitted.

The first electrode 210 and the second electrode 220 of the display device 10 may not necessarily have the shape extending in one direction. The shapes of the first electrode 210 and the second electrode 220 of the display device 10 may not be particularly limited as long as they are spaced apart from each other to provide therebetween the space in which the light emitting elements 300 are disposed.

FIG. 24 is a schematic plan view illustrating a pixel of a display device according to still another embodiment.

Referring to FIG. 24, at least some areas of a first electrode 210_2 and a second electrode 220_2 of a display device 10_2 according to the embodiment have curvilinear shapes, and a curvilinear area of the first electrode 210_2 may face the curvilinear area of the second electrode 220_2 while being spaced apart from each other. The display device 10_2 according to the embodiment differs from the display device 10 of FIG. 21 at least in that the shapes of the first and second electrodes 210_2 and 220_2 are different from those of the display device 10. In the following description, repetitive descriptions thereof will be omitted while focusing on differences.

The first electrode 210_2 of the display device 10_2 of FIG. 24 may include multiple holes HOL. For example, as illustrated in the drawing, the first electrode 210_2 may include a first hole HOL1, a second hole HOL2, and a third hole HOL3 arranged in the second direction DR2. However, the disclosure is not limited thereto, and the first electrode 210_2 may include a larger number of holes HOL, a smaller number of holes HOL, or a single hole HOL. The description will hereinafter be provided for an example where the first electrode 210_2 includes the first hole HOL1, the second hole HOL2, and the third hole HOL3.

In an embodiment, the first hole HOL1, the second hole HOL2, and the third hole HOL3 may have a circular shape in a plan view. Accordingly, the first electrode 210_2 may have curved areas formed by the holes HOL and face the second electrodes 220_2 in these curved areas. However, this is merely exemplary, and the disclosure is not limited thereto. The shapes of the first hole HOL1, the second hole HOL2, and the third hole HOL3 are not limited to particular shapes as long as they can provide spaces for accommodating the second electrodes 220_2 therein. By way of example, the holes may have elliptical shapes, polygonal shapes such as rectangles, or the like in a plan view.

Multiple second electrodes 220_2 may be disposed in each sub-pixel PXn. By way of example, three second electrodes 220_2 may be disposed in each sub-pixel PXn to correspond to the first to third holes HOL1, HOL2, and HOL3 of the first electrode 210_2. The second electrodes 220_2 may be respectively disposed within the first to third holes HOL1, HOL2, and HOL3, and surrounded by the first electrode 210_2.

In an embodiment, the holes HOL of the first electrode 210_2 may have curved surfaces, and each second electrode 220_2 placed in the corresponding hole HOL of the first electrode 210_2 may also have a curved surface and be disposed to face the first electrode 210_2 with a gap therebetween. As illustrated in FIG. 24, the first electrode 210_2 may include the holes HOL having circular shapes in a plan view, and the second electrodes 220_2 may have circular shapes in a plan view. The curved surface of the area of the first electrode 210_2 where each hole HOL is formed may face the curved outer surface of the corresponding one of the second electrodes 220_2 with a gap therebetween. For example, the first electrode 210_2 may be disposed to surround the outer surfaces of the second electrodes 220_2.

As stated above, light emitting elements 300 may be disposed between the first electrode 210_2 and the second electrode 220_2. The display device 10_2 according to the embodiment may include the second electrode 220_2 having the circular shape and the first electrode 210_2 disposed to surround it, and the multiple light emitting elements 300 may be arranged along the outer surface of the second electrode 220_2. As stated above, since the light emitting elements 300 have the shapes extending in a direction, the light emitting elements 300 arranged along the curved outer surface of the second electrode 220_2 in each sub-pixel PXn may be disposed such that their extension directions are directed in different directions. Each sub-pixel PXn may have many different light emission directions depending on the directions in which the extension directions of the light emitting elements 300 are directed. In the display device 10_2 according to the embodiment, by disposing the first and second electrodes 210_2 and 220_2 to have the curvilinear shapes, the light emitting elements 300 disposed between them may be oriented toward different directions, and lateral visibility of the display device 10_2 can be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A light emitting element comprising:
   a semiconductor core having at least a partial region extending in a direction and including:
      a first end;
      a second end; and
      a main body part between the first end and the second end;
   a first electrode layer surrounding the second end of the semiconductor core;
   a second electrode layer surrounding at least the first end of the semiconductor core and spaced apart from the first electrode layer; and
   an insulating film surrounding the semiconductor core, the first electrode layer, and the second electrode layer,
   wherein the second end of the semiconductor core has a diameter smaller than a diameter of the main body part.

2. The light emitting element of claim 1, wherein
   the first electrode layer is spaced apart from the main body part and surrounds at least a partial region of the second end, and
   the second electrode layer surrounds the first end and the main body part.

3. The light emitting element of claim 2, wherein in the first electrode layer, a thickness of a side adjacent to the main body part is smaller than a thickness of another side opposite to the side.

4. The light emitting element of claim 2, wherein in the main body part, a diameter of a region adjacent to the first end is greater than a diameter of a region adjacent to the second end.

5. The light emitting element of claim 4, wherein the first end has an inclined outer surface.

6. The light emitting element of claim 1, wherein
the semiconductor core includes:
   a first semiconductor layer;
   an active layer surrounding at least a partial region of the first semiconductor layer; and
   a second semiconductor layer surrounding a partial region of the first semiconductor layer and the active layer,
the first electrode layer electrically contacts the first semiconductor layer, and
the second electrode layer electrically contacts the second semiconductor layer.

7. The light emitting element of claim 6, wherein
the first semiconductor layer includes:
   a first portion extending in the direction;
   a second portion located on a side of the first portion; and
   a third portion located on another side of the first portion and extending in the direction,
the second portion has an inclined outer surface.

8. The light emitting element of claim 7, wherein
a diameter of the third portion is smaller than a diameter of the first portion, and
an outer surface of the third portion is recessed from an outer surface of the first portion toward a center of the first semiconductor layer.

9. The light emitting element of claim 8, wherein
the first electrode layer surrounds a partial region of the outer surface of the third portion and is spaced apart from the first portion, and
an end surface of the third portion opposite to the first portion is exposed.

10. The light emitting element of claim 7, wherein the active layer surrounds an outer surface of the first portion.

11. The light emitting element of claim 10, wherein
the first semiconductor layer is doped with first conductivity type impurities,
the second semiconductor layer is doped with second conductivity type impurities,
the first semiconductor layer includes a doped region in which at least a partial region of the second portion is doped with the second conductivity type impurities, and
the active layer is also disposed between the doped region and the second semiconductor layer.

12. A manufacturing method for a light emitting element, comprising:
   forming, on an underlying substrate, a semiconductor core including a first end, a second end, and a main body part between the first end and the second end;
   forming a first electrode layer surrounding at least a partial region of the second end of the semiconductor core and a second electrode layer surrounding the first end and the main body part and spaced apart from the first electrode layer; and
   forming an insulating film surrounding the first electrode layer, the second electrode layer, and the semiconductor core and performing separation from the underlying substrate.

13. The manufacturing method of claim 12, wherein
in the semiconductor core, a diameter of the second end is smaller than a diameter of the main body part, and
an outer surface of the second end has a shape recessed from an outer surface of the main body part.

14. The manufacturing method of claim 13, wherein
the forming of the first electrode layer and the second electrode layer is performed by depositing a material of the first electrode layer and the second electrode layer on an outer surface of the semiconductor core, and
the material is not deposited between the second end and the main body part.

15. The manufacturing method of claim 13, wherein the forming of the semiconductor core comprises:
   forming a first mask layer disposed on the underlying substrate, a second mask layer disposed on the first mask layer, and an etch hole penetrating the first mask layer and the second mask layer to partially expose the underlying substrate;
   growing a first semiconductor layer along the etch hole and removing the second mask layer to expose a part of the first semiconductor layer;
   forming an active layer and a second semiconductor layer on the exposed first semiconductor layer; and
   removing the first mask layer.

16. The manufacturing method of claim 15, wherein a diameter of the etch hole of the first mask layer is smaller than a diameter of the etch hole of the second mask layer.

17. The manufacturing method of claim 16, wherein
the first semiconductor layer includes:
   a first portion extending in a direction;
   a second portion located on a side of the first portion; and
   a third portion located on another side of the first portion and extending in the direction, wherein
the third portion is grown along the etch hole of the first mask layer, and
the first portion is grown along the etch hole of the second mask layer.

18. A display device comprising:
a first electrode disposed on a substrate;
a second electrode disposed on the substrate and spaced apart from the first electrode; and
at least one light emitting element disposed between the first electrode and the second electrode, wherein
the light emitting element includes:
   a semiconductor core having at least a partial region extending in a direction and including a first end, a second end, and a main body part between the first end and the second end;
   a first electrode layer surrounding the second end of the semiconductor core;
   a second electrode layer surrounding at least the first end of the semiconductor core and spaced apart from the first electrode layer; and
   an insulating film surrounding the semiconductor core, the first electrode layer, and the second electrode layer,
the second end of the semiconductor core has a diameter smaller than that of the main body part.

19. The display device of claim 18, wherein
the first electrode layer is spaced apart from the main body part and surrounds at least a partial region of the second end, and
the second electrode layer surrounds the first end and the main body part.

20. The display device of claim 19, further comprising:
a first contact electrode electrically contacting the first electrode and the second electrode layer; and
a second contact electrode electrically contacting the second electrode and the first electrode layer.

21. The display device of claim 20, wherein
at least a partial region of the insulating film of the light emitting element is removed to partially expose the first electrode layer and the second electrode layer, the first contact electrode electrically contacts the exposed second electrode layer, and the second contact electrode electrically contacts the exposed first electrode layer and the second end of the semiconductor core.

22. The display device of claim 19, wherein the display device includes;
- a first pixel; and
- a second pixel, the light emitting element includes:
- a first light emitting element disposed in the first pixel; and
- a second light emitting element disposed in the second pixel, and a diameter of a central portion of the first light emitting element is smaller than a diameter of a central portion of the second light emitting element.

23. The display device of claim 22, wherein a first light emitted from the first light emitting element has a central wavelength band shorter than a central wavelength band of a second light emitted from the second light emitting element.

* * * * *